United States Patent
Konishi

(10) Patent No.: US 9,793,315 B2
(45) Date of Patent: Oct. 17, 2017

(54) SOLID-STATE IMAGING APPARATUS FOR CONVERTING INCIDENT LIGHT ENTERED FROM ONE SURFACE INTO ELECTRICAL SIGNALS ON ANOTHER SURFACE

(75) Inventor: Takefumi Konishi, Osaka (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 464 days.

(21) Appl. No.: 14/234,791

(22) PCT Filed: May 24, 2012

(86) PCT No.: PCT/JP2012/003401
§ 371 (c)(1),
(2), (4) Date: Jan. 24, 2014

(87) PCT Pub. No.: WO2013/014839
PCT Pub. Date: Jan. 31, 2013

(65) Prior Publication Data
US 2014/0166860 A1 Jun. 19, 2014

(30) Foreign Application Priority Data
Jul. 26, 2011 (JP) .................................. 2011-163619

(51) Int. Cl.
H01L 27/146 (2006.01)
H01L 27/148 (2006.01)

(52) U.S. Cl.
CPC .... *H01L 27/14687* (2013.01); *H01L 27/1464* (2013.01); *H01L 27/14614* (2013.01);
(Continued)

(58) Field of Classification Search
CPC .......... H01L 27/14614; H01L 27/1464; H01L 27/14806; H01L 27/14689;
(Continued)

(56) References Cited

U.S. PATENT DOCUMENTS 4,774,557 A * 9/1988 Kosonocky ....... H01L 27/14806
257/222
5,907,356 A * 5/1999 Morimoto ......... H01L 27/14812
257/230
(Continued)

FOREIGN PATENT DOCUMENTS

CN 102097444 A 6/2011
JP 2008066480 A * 3/2008
(Continued)

OTHER PUBLICATIONS

Official Communication issued in corresponding European Patent Application No. 12817651.8, dated May 11, 2015.
(Continued)

*Primary Examiner* — Que T Le
*Assistant Examiner* — Jennifer Bennett
(74) *Attorney, Agent, or Firm* — Keating & Bennett, LLP

(57) ABSTRACT

A solid-state imaging apparatus 100a comprises: photoelectric conversion elements PD1 and PD2 formed within a first conductivity type semiconductor substrate 100; and transfer transistors Tt1 and Tt2 formed on a first main surface of the semiconductor substrate 100, for transferring the signal charge generated by the photoelectric conversion elements outside the photoelectric conversion elements. The gate electrode 107 of each of the transfer transistors is configured to be disposed over a surface of a first main surface side of an electric charge accumulating region 102, which configures each of the photoelectric conversion elements PD1 and PD2. As a result, a high-resolution image can be achieved, in which noises and afterimages are further suppressed.

10 Claims, 10 Drawing Sheets

(52) U.S. Cl.
CPC .. *H01L 27/14641* (2013.01); *H01L 27/14689*
(2013.01); *H01L 27/14806* (2013.01)

(58) Field of Classification Search
CPC ......... H01L 27/14641; H01L 27/14643; H01L 27/14612; H01L 27/14616; H01L 27/14687
USPC ....... 250/208.1, 214 R, 214.1; 257/257, 258, 257/290, 291, 292, 431, 450, 461, 462, 257/463, 464; 348/294, 302
See application file for complete search history.

(56) References Cited

U.S. PATENT DOCUMENTS

| | | | | |
|---|---|---|---|---|
| 6,821,809 | B2 * | 11/2004 | Abe | H01L 23/544 257/E23.179 |
| 7,535,073 | B2 * | 5/2009 | Ezaki | H01L 27/14603 257/432 |
| 7,592,579 | B2 * | 9/2009 | Tamura | H01L 27/14603 250/208.1 |
| 7,999,342 | B2 * | 8/2011 | Hsu | H01L 27/1464 257/447 |
| 2008/0283726 | A1 * | 11/2008 | Uya | H01L 27/14603 250/208.1 |
| 2008/0297634 | A1 * | 12/2008 | Uya | H01L 27/14623 348/294 |
| 2009/0140304 | A1 * | 6/2009 | Kudoh | H01L 27/14603 257/292 |
| 2009/0179232 | A1 | 7/2009 | Adkisson et al. | |
| 2010/0026866 | A1 | 2/2010 | Matsumoto et al. | |
| 2010/0243864 | A1 | 9/2010 | Itonaga | |
| 2011/0032405 | A1 * | 2/2011 | Nozaki | H01L 27/14603 348/308 |
| 2011/0121371 | A1 * | 5/2011 | Sakano | H01L 27/14609 257/292 |
| 2011/0169055 | A1 | 7/2011 | Wu et al. | |
| 2011/0181749 | A1 * | 7/2011 | Yamada | H01L 27/1461 348/222.1 |

FOREIGN PATENT DOCUMENTS

JP 2011-114062 6/2011
WO 2010/051365 A2 5/2010

OTHER PUBLICATIONS

International Search Report and Written Opinion for International Application No. PCT/JP2012/003401 (dated Aug. 28, 2012).

* cited by examiner (a)

(b)

(a)

(b)

SOLID-STATE IMAGING APPARATUS FOR CONVERTING INCIDENT LIGHT ENTERED FROM ONE SURFACE INTO ELECTRICAL SIGNALS ON ANOTHER SURFACE

CROSS-REFERENCE TO RELATED APPLICATIONS

This application is a National Phase application filed under 35 USC 371 of PCT International Application No. PCT/JP2012/003401 with an International Filing Date of May 24, 2012, which claims under 35 U.S.C. §119(a) the benefit of Japanese Application No. 2011-163619, filed Jul. 26, 2011, the entire contents of which are incorporated herein by reference.

TECHNICAL FIELD

The present invention relates to a solid-state imaging apparatus and a driving method of the solid-state imaging apparatus, a manufacturing method of a solid-state imaging apparatus, and an electronic information device. More particularly, the present invention relates to: a solid-state imaging apparatus for photoelectrically converting incident light from a subject, which has entered from one surface of a semiconductor substrate, by a photoelectric conversion element within the semiconductor substrate, and converting signal charges obtained by the photoelectric conversion into electric signals on the other surface side of the semiconductor substrate to capture an image, and a driving method of the solid-state imaging apparatus; a manufacturing method of such a solid-state imaging apparatus; and an electronic information device equipped with such a solid-state imaging apparatus.

BACKGROUND ART

In recent years, the development of a back side illumination type solid-state imaging apparatus as a highly sensitive solid-state imaging apparatus has been advancing. Such a back side illumination type solid-state imaging apparatus is configured to include circuit elements, wiring layers and the like formed on the front surface side of a silicon substrate and allow light to enter into the back surface side of the silicon substrate to capture an image.

With the solid-state imaging apparatus having such a configuration, the aperture ratio for receiving light can be increased and the absorption or reflection of incident light towards the photoelectric conversion element can be suppressed.

For example, Patent Literature 1 discloses a conventional, back-surface light receiving type (back side illumination type) CMOS image sensor.

FIG. 9 is a diagram for describing the back side illumination type CMOS image sensor disclosed in Patent Literature 1. FIG. 9(a) schematically illustrates an overall configuration of the CMOS image sensor. FIG. 9(b) illustrates a circuit configuration of a unit pixel in the CMOS image sensor.

A CMOS image sensor 10 comprises: a pixel section 11 obtained by arranging pixels (hereinafter, also referred to as unit pixels) in rows and columns; a vertical selection circuit (V selection circuit) 12 for selecting, in a unit of one row, the pixels of the pixel section 11; and a signal processing circuit (S/H, CDS circuit) 13 for performing a noise reduction process on, and retaining, pixel signals from pixels in a pixel row selected by the vertical selection circuit 12. The signal processing circuit 13 performs a process of removing a fixed noise pattern for each pixel, on pixel signals from pixels of each of the selected rows.

The CMOS image sensor 10 further comprises: a horizontal selection circuit (H selection circuit) 14 for selecting and outputting pixel signals retained in the signal processing circuit 13 in order; an AGC circuit 16 for amplifying the pixel signals' output from the signal processing circuit 13 with an appropriate gain; an A/D converter 17 for converting the pixel signals amplified by the AGC circuit 16 into digital pixel signals; a digital amplifier 18 for amplifying and outputting the digital pixel signals; and a timing generating section (TG) 15 for generating timing signals for controlling each of the circuits described above.

As illustrated in FIG. 9(b), a unit pixel Px comprises: a photoelectric conversion element (photodiode) 21 for generating signal charges by photoelectric conversion of incident light; a transfer transistor 22 for transferring signal charges generated in the photodiode to an electric charge accumulating section FD; a reset transistor 25 connected in between a power source Vdd and the electric charge accumulating section FD for resetting electric charges of the electric charge accumulating section FD; and an amplifying transistor 23 and a selecting transistor (address transistor) 24 connected in series in between a reading signal line (vertical signal line) 27 and the power source Vdd. Here, the selecting transistor (address transistor) 24 is for selecting a row of pixels, and the amplifying transistor 23, the gate of which is connected to the electric charge accumulating section FD, is for amplifying and outputting an electric potential of the electric charge accumulating section FD.

Here, the gate of the transfer transistor 22 is connected with a transfer wire 26, the gate of the reset transistor 25 is connected with a rest wire 29, and the gate of the address transistor 24 is connected with an address wire 28. Further, one end of the vertical signal line 27 is connected with a constant current circuit I.

Further, the CMOS image sensor 10 is formed on a semiconductor substrate, such as a silicon substrate. Hereinafter, a region (pixel region) in which a pixel section is formed and a region (peripheral circuit region) in which peripheral circuits are formed, in the semiconductor substrate, will be described.

FIG. 10 illustrates a cross sectional structure of a pixel region and a peripheral circuit region of the semiconductor substrate.

Herein, an $N^-$ type silicon substrate 41 is used as the semiconductor substrate, and the thickness thereof is desirably 5 μm to 15 μm with regard to visible light, and it set to be 10 μm.

In the pixel region of the $N^-$ type silicon substrate 41, a shallow, back surface $P^+$ layer 42 is formed on one surface (back surface) side throughout the entire surface of the pixel section. Further, a pixel separating region for separating adjusting pixels is formed by a deep P well 43, which is connected with the back surface $P^+$ layer 42.

A photodiode 37 is formed in an $N^-$ type region 44a, which is the region of the $N^-$ type silicon substrate 41 where the P well 43 is not formed. The $N^-$ type region 44a is a photoelectric conversion region. The area thereof is small and has a low impurity concentration so that it is completely depleted. An electric charge accumulating $N^+$ region 44 is formed on the $N^-$ type region 44a, the region 44 accumulating signal charges (electrons). A front surface $P^+$ layer 45 is formed further thereon for realizing an embedded photodiode. Herein, in the embedded photodiode, the front surface $P^+$ layer 45 is formed on the front surface of the electric charge accumulating $N^+$ region 44 to increase a concentration of holes which are likely to be coupled with noise electric charges (electrons) thermally generated due to crystal defects or the like on the front surface of the electric charge accumulating $N^+$ region 44 for accumulating the signal charge (electrons), and suppress noise due to noise electric charges, except for signal charges, by shortening the life span of the noise electric charges.

The photodiode 37 is formed such that the surface area on the light receiving surface (back surface) side is formed to be larger than the surface area on the wiring layer (front surface side) side. As a result, incident light can be taken in efficiently. Signal charges photoelectrically converted by the $N^-$ type region 44a and accumulated by the electric charge accumulating $N^+$ region 44, the regions which constitute the photodiode 37, are transferred to an $N^+$ type region 47, functioning as an electric charge accumulating section (floating diffusion) FD, by a transfer transistor 46 (transfer transistor 22 in FIG. 9(b)). The $N^-$ type region 44a and electric charge accumulating $N^+$ region 44 constituting the photodiode 37 are electrically separated from the $N^+$ type region 47 constituting the electric charge accumulating section FD by an electric charge transfer $P^-$ layer 48.

The transistors (amplifying transistor 23, address transistor 24 and rest transistor 25 in FIG. 9(b)), except for the transfer transistor 46 within a pixel, are formed in a normal manner in the deep P well 43. On the other hand, with regard to the peripheral circuit region, a P well (Pwell) 49 is formed at a depth that does not reach the back surface $P^+$ layer 42, and an N well (Nwell) 50 is further formed inside the P well 49, thus configuring a CMOS circuit formed in the regions of the wells 49 and 50.

In a solid-state imaging apparatus having such a configuration, a pixel structure is used such that a gate electrode and a wiring layer comprising a plurality of wires positioned further outside the gate electrode are formed on the outside of one of the surfaces on which a photoelectric conversion element of a silicon substrate is formed, and light is allowed to enter into the other surface of the silicon substrate, so that it will not be necessary to lay out the wiring in consideration of a light receiving surface.

Thus, the degree of freedom increases for the wiring that constitutes the pixel, thereby miniaturizing the pixel. Further, with regard to the silicon substrate 41, the surface area on the lighting surface side of the $N^-$ type region 44a, where photoelectric conversion is performed, is formed to be larger than the surface area on the side closer to the electric charge accumulating $N^+$ region 44 for accumulating signal charges, so that incident light can be taken in efficiently.

CITATION LIST

Patent Literature

[PTL 1]
Japanese Patent No. 3759435

SUMMARY OF INVENTION

Technical Problem

Since conventional solid-state imaging apparatuses have a structure such that a front surface region of an embedded photodiode 37 is exposed, plasma damage is applied on the photodiode surface when a gate electrode material, such as polysilicon, is etched to form a gate electrode of a transfer transistor. This is a factor in the generation of noise electric charges.

Thus, according to conventional techniques, the front surface region of the photodiode is formed to be a high concentration region (front surface $P^+$ layer 45) to reduce noise due to noise electric charges. Specifically, the impurity concentration of the front surface region of the photodiode is increased to increase the hole concentration, so that the time before noise electric charges (electrons) thermally generated on the front surface region of the photodiode couple with a hole to disappear (lifespan) will be shortened, thereby suppressing noise due to the noise electric charges.

With the conventional techniques, however, the front surface $P^+$ layer 45 of the photodiode is formed by high concentration ion implantation, which applies ion implantation damage to the surface of the photodiode. Although a thermal treatment or the like is performed in order to recover from such damage by the ion implantation, such a thermal treatment cannot be performed until a complete recovery is achieved from the damage because the impurities implanted by the ion implantation will be diffused. Thus, it is not possible to recover the front surface side of the photodiode into a state thoroughly free of damage from the ion implantation.

Furthermore, in conventional solid-state imaging apparatuses, since the front surface $P^+$ layer 45, which constitutes the embedded photodiode 37, adjoins the electric charge transfer $P^-$ layer 48, which constitutes the well region of the transfer transistor 46, the height of a potential barrier is set such that the potential barrier will not be an obstacle to electric charge transferring in an electric charge transferring path from the electric charge accumulating $N^+$ region 44 for accumulating signal charges (electrons) through the electric charge transfer $P^-$ layer 48 functioning as a transfer channel to the $N^+$ type region 47 functioning as an electric charge accumulating section FD during electric charge transferring, by arranging the front surface $P^+$ layer 45 and a gate electrode 46a of the transfer transistor 46 in such a manner that they will not overlap with each other.

Thus, it is necessary to further increase the impurity concentration of the electric charge transfer $P^-$ layer 48 in order to suppress the generation of noise electric charges in the transition region from the front surface $P^+$ layer 45 to the electric charge transfer $P^-$ layer 48. In such a case, however, the potential barrier will be higher in the electric charge transfer $P^-$ layer 48 in the electric charge transferring path from the electric charge accumulating $N^+$ region 44 through the electric charge transfer $P^-$ layer 48 to the $N^+$ type region 47. This causes the deterioration of the transfer characteristics and the securing of the amount of saturation charges will be difficult. While this amount of saturation charges is the maximum amount of saturation charges accumulatable in the photodiode 37, the amount is set so that it will correspond to the maximum amount of saturation charges transferable from the photodiode to the electric charge accumulating section FD.

On the other hand, in order to secure the amount of saturation charges, it will be necessary to reduce the impurity concentration in the transition region from the front surface $P^+$ layer 45 to the electric charge transfer $P^-$ layer 48. In such a case, it will be difficult to suppress noise electric charges fully. Specifically, as the hole concentration of the front surface $P^+$ layer 45 and the electric charge transfer $P^-$ layer 48 is decreased so that the impurity concentration of those layers is reduced, the time before noise electric charges (electrons) thermally generated in those layers couple with a hole to disappear (life span) will be extended, which makes noise due to the noise electric charges obvious.

The present invention is intended to solve the conventional problems described above. It is an objective of the present invention to provide a solid-state imaging apparatus, capable of lightening damage due to etching and ion implantation in a region for forming a photoelectric conversion element and a peripheral region thereof of a semiconductor substrate, thereby suppressing the generation of noise electric charges to reduce an impurity concentration in an electric charge transferring path from an photoelectric conversion element to an electric charge accumulating section in the semiconductor substrate, and as a result, capable of making the suppression of noise electric charges and the securing of the amount of saturation charges compatible with each other, and a driving method of the solid-state imaging apparatus; a manufacturing method of the solid-state imaging apparatus; and an electronic information device.

Solution to Problem

A solid-state imaging apparatus according to the present invention comprises a photoelectric conversion element formed within a first conductivity type semiconductor substrate, for generating a signal charge in photoelectric conversion of incident light, the solid-state imaging apparatus converting, and outputting, the signal charge generated by the photoelectric conversion element into an image signal by signal processing, where the solid-state imaging apparatus comprises a transfer transistor formed on a first main surface side of the first conductivity type semiconductor substrate, for transferring a signal charge generated by the photoelectric conversion element to the outside of the photoelectric conversion element; where the photoelectric conversion element includes: a second conductivity type photoelectric conversion region for photoelectrically converting incident light taken from a second main surface of the first conductivity type semiconductor substrate on the opposite side of the first main surface; and a second conductivity type electric charge accumulating region for accumulating a signal charge generated by photoelectric conversion in the second conductivity type photoelectric conversion region, on to the first main surface side of the first conductivity type semiconductor substrate; and where a gate electrode of the transfer transistor is disposed over a surface of the first main surface side of the second conductivity type electric charge accumulating region, thereby achieving the objective described above.

Preferably, in a solid-state imaging apparatus according to the present invention, the solid-state imaging apparatus further comprises: a second conductivity type signal charge accumulating section for accumulating a signal, charge transferred from the photoelectric conversion element; and a first conductivity type electric charge transferring region for transferring the signal charge from the second conductivity type electric charge accumulating region to the second conductivity type signal charge accumulating section, and where the second conductivity type electric charge accumulating region is disposed separately from the second conductivity type signal charge accumulating section, with the first conductivity type electric charge transferring region interposed therebetween.

Still preferably, in a solid-state imaging apparatus according to the present invention, a space between the second conductivity type electric charge accumulating region and the second conductivity type signal charge accumulating section is equal to or greater than a minimum distance that does not substantially cause a short channel effect as well as equal to or smaller than a permissible maximum distance that is determined by the degree of integration of pixels in the solid-state imaging apparatus.

Still preferably, in a solid-state imaging apparatus according to the present invention, the space between the second conductivity type electric charge accumulating region and the second conductivity type signal charge accumulating section is within the range of
0.2 μm to 1.0 μm.

Still preferably, in a solid-state imaging apparatus according to the present invention, the solid-state imaging apparatus comprises a first conductivity type front surface semiconductor region formed on the first main surface side of the second conductivity type electric charge accumulating region so as to cover the second conductivity type electric charge accumulating region, and the first conductivity type front surface semiconductor region has an impurity concentration that exceeds an impurity concentration of the first conductivity type electric charge transferring region.

Still preferably, in a solid-state imaging apparatus according to the present invention, the solid-state imaging apparatus comprises a first conductivity type well region formed within the first conductivity type semiconductor substrate, and the first conductivity type front surface semiconductor region has an impurity concentration that is equal to or smaller than an impurity concentration of the first conductivity type well region.

Still preferably, in a solid-state imaging apparatus according to the present invention, the gate electrode of the transfer transistor is disposed over the surfaces on the first main surface side, of the first conductivity type front surface semiconductor region, the first conductivity type electric charge transferring region and the first conductivity type well region.

Still preferably, in a solid-state imaging apparatus according to the present invention, the first conductivity type well region is formed to surround a region that constitutes the second conductivity type electric charge accumulating region, the first conductivity type electric charge transferring region and the second conductivity type signal charge accumulating section.

A solid-state imaging apparatus according to the present invention comprises a photoelectric conversion element formed within a first conductivity type semiconductor substrate, for generating a signal charge in photoelectric conversion of incident light, the solid-state imaging apparatus converting, and outputting, the signal charge generated by the photoelectric conversion element into an image signal by signal processing, where the solid-state imaging apparatus comprises a transfer transistor formed on a first main surface side of the first conductivity type semiconductor substrate, for transferring a signal charge generated in the photoelectric conversion element to the outside of the photoelectric conversion element; where the photoelectric conversion element includes: a second conductivity type photoelectric conversion region for photoelectrically converting incident light taken from a second main surface of the first conductivity type semiconductor substrate on the opposite side of the first main surface; a second conductivity type electric charge accumulating region for accumulating a signal charge generated by photoelectric conversion in the second conductivity type photoelectric conversion region, on the first main surface side of the first conductivity type semiconductor substrate; and a first conductivity type front surface semiconductor region formed on the first main surface side of the second conductivity type electric charge accumulating region, so as to cover the second conductivity type electric charge accumulating region, and where the first conductivity type front surface semiconductor region has an impurity concentration that is equal to or smaller than an impurity concentration of a first conductivity type well region formed in the first conductivity type semiconductor substrate to surround the second conductivity type electric charge accumulating region, thereby achieving the objective described above.

Preferably, in a solid-state imaging apparatus according to the present invention, the solid-state imaging apparatus further comprises: a second conductivity type signal charge accumulating section for accumulating a signal charge transferred from the photoelectric conversion element; and a first conductivity type electric charge transferring region for transferring the signal charge from the second conductivity type electric charge accumulating region to the second conductivity type signal charge accumulating section, where the second conductivity type electric charge accumulating region is disposed separated from the second conductivity type signal charge accumulating section, with the first conductivity type electric charge transferring region interposed therebetween, and where the gate electrode of the transfer transistor is disposed over the surfaces on the first main surface side of the first conductivity type front surface semiconductor region, the first conductivity type electric charge transferring region and the first conductivity type well region.

Still preferably, in a solid-state imaging apparatus according to the present invention, a space between the second conductivity type electric charge accumulating region and the second conductivity type signal charge accumulating section is equal to or greater than a minimum distance that does not substantially cause a short channel effect as well as equal to or smaller than a permissible maximum distance that is determined by the degree of integration of pixels in the solid-state imaging apparatus.

Still preferably, in a solid-state imaging apparatus according to the present invention, a space between the second conductivity type electric charge accumulating region and the second conductivity type signal charge accumulating section is within the range of 0.2 µm to 1.0 µm.

Still preferably, in a solid-state imaging apparatus according to the present invention, the first conductivity type electric charge transferring region is disposed to surround the second conductivity type signal charge accumulating section.

Still preferably, in a solid-state imaging apparatus according to the present invention, the solid-state imaging apparatus comprises: a reset transistor for resetting the signal charge of the second conductivity type signal charge accumulating section; and an amplifying transistor for amplifying signal voltage generated in accordance with the signal charge accumulated in the second conductivity type signal charge accumulating section, where the reset transistor and the amplifying transistor are shared among a plurality of pixels.

A method for driving a solid-state imaging apparatus according to the present invention comprises applying an electric potential between the gate electrode of the transfer transistor and the first conductivity type front surface semiconductor region, during an electric charge accumulating period during which the signal charge is generated by photoelectric conversion of incident light and accumulated at the photoelectric conversion element, so that the electric potential of the gate electrode of the transfer transistor will be smaller than the electric potential of the first conductivity type front surface semiconductor region, thereby achieving the objective described above.

Preferably, in a method for driving a solid-state imaging apparatus according to the present invention, during the electric charge accumulating period, negative voltage generated in peripheral circuit sections, except for a pixel region, is applied to the gate electrode of the transfer transistor, and a grounding electric potential of the peripheral circuit sections is applied to the first conductivity type front surface semiconductor region.

Still preferably, in a method for driving a solid-state imaging apparatus according to the present invention, during the electric charge accumulating period, a grounding electric potential of the peripheral circuit sections is applied to the gate electrode of the transfer transistor, and positive voltage is applied to the first conductivity type front surface semiconductor region.

Still preferably, in a method for driving a solid-state imaging apparatus according to the present invention, during an electric charge transferring period in which the signal charge accumulated in the photoelectric conversion element during the electric charge accumulating period is transferred to the signal charge accumulating section, voltage is applied between the gate electrode of the transfer transistor and the first conductivity type front surface semiconductor region so that an electric potential of the gate electrode of the transfer transistor will be greater than an electric potential of the first conductivity type front surface semiconductor region.

A method for manufacturing a solid-state imaging apparatus according to the present invention comprises: a step of forming the photoelectric conversion element in the first conductivity type semiconductor substrate; and a step of forming the gate electrode of the transfer transistor after forming the photoelectric conversion element, where the step of forming the photoelectric conversion element comprises a step of implanting second conductivity type impurities from the first main surface side of the first conductivity type semiconductor substrate to form the second conductivity type electric charge accumulating region, and where the step of forming the gate electrode of the transfer transistor comprises: a step of depositing a constituent material of the gate electrode of the transfer transistor over the first main surface; and a step of forming the gate electrode to be disposed over the surface on the first main surface side of the second conductivity type electric charge accumulating region by selectively etching the deposited constituent material of the gate electrode, thereby achieving the objective described above.

Preferably, in a method for manufacturing a solid-state imaging apparatus according to the present invention, the method further comprises a step of forming the first conductivity type front surface semiconductor region by implanting first conductivity type impurities into the front surface of the second conductivity type electric charge accumulating region from the first main surface side of the first conductivity type semiconductor substrate.

Still preferably, in a method for manufacturing a solid-state imaging apparatus according to the present invention, the method comprises a step of forming the second conductivity type signal charge accumulating section after forming the gate electrode of the transfer transistor.

A method for manufacturing a solid-state imaging apparatus according to the present invention comprises: a step of forming the first conductivity type well region in the first conductivity type semiconductor substrate; and a step of forming the photoelectric conversion element in the first conductivity type well region, and the step of forming the photoelectric conversion element comprises: a step of forming the second conductivity type electric charge accumulating region by implanting second conductivity type impurities from first main surface side of the first conductivity type semiconductor substrate; and a step of forming the first conductivity type front surface semiconductor region having impurity concentration equal to or smaller than the impurity concentration of the first conductivity type well region, by implanting first conductivity type impurities into the front surface of the second conductivity type electric charge accumulating region from the first main surface side of the first conductivity type semiconductor substrate, thereby achieving the objective described above.

Preferably, in a method for manufacturing a solid-state imaging apparatus according to the present invention, the second conductivity type electric charge accumulating region and the first conductivity type front surface semiconductor region are formed by implanting impurities using the same ion implantation mask.

An electronic information device according to the present invention comprises a solid-state imaging apparatus according to the present invention, thereby achieving the objective described above.

Next, the function of the present invention will be described hereinafter.

In the present invention, the gate electrode of the transfer transistor is disposed over the surface of the semiconductor substrate on the opposite side from the light irradiation surface, in the electric charge accumulating region of the electric conversion element, so that the electric charge accumulating region of the electric conversion element will not be damaged from plasma etching in the process of forming the transfer gate electrode, thus suppressing the generation of noise electric charge due to crystal defects. Thus, the impurity concentration of the P type semiconductor region, which is formed in the front surface region of the electric charge accumulating region, can be reduced and the impurity concentration of an electric charge transferring region adjacent to this electric charge accumulating region can be suppressed to be low. As a result, the amount of variation of the potential level in the electric charge transferring region can be increased, thereby increasing the efficiency of electric charge transferring.

Further, all of the impurity regions within the semiconductor substrate, except for the signal charge accumulating region, are formed prior to the forming of the transfer gate electrode. Thus, the impurity region within the semiconductor substrate, except for the signal charge accumulating region, will be formed without being damaged by plasma etching during the formation of the transfer gate electrode. As a result, favorable crystallinity can be secured and causes of deterioration of the characteristics, such as leak current, can be eliminated.

By eliminating a rapid change in the impurity concentration in the transition region from the first conductivity type front surface semiconductor region to the electric charge transfer section on the front surface side of the photoelectric conversion element that is different from the light irradiation surface, as described above, the suppression of noise electric charges and the securing of the amount of saturation charges can be compatible with each other, and further, the plasma damage to the surface of the photoelectric conversion element due to the gate electrode etching and the implantation damage by ion implantation can be eliminated.

Further, in the present invention, negative bias is applied to the transfer gate electrode during accumulation of electric charges, so that the hole concentration can be stably kept in the front surface semiconductor region of the photoelectric conversion element.

In the present invention, the first conductivity type electric charge transferring region is disposed in such a manner to surround the second conductivity type signal charge accumulating section, so that the electric charge transfer path from the second conductivity type electric charge accumulating region of the photoelectric conversion element to the second conductivity type signal charge accumulating section is formed at a position away from a well region that is positioned in the periphery of the first conductivity type electric charge transferring region.

Thus, the influence by impurity diffusion that is from the first conductivity type well region positioned in the periphery of the first conductivity type electric charge transferring region to the electric charge transfer path in the first conductivity type electric charge transferring region can be reduced.

Further, since the first conductivity type electric charge transferring region including the electric charge transferring path is formed in such a manner to surround the periphery of the second conductivity type signal charge accumulating section, the area occupied by the first conductivity type electric charge transferring region can be larger on the semiconductor substrate, thereby preventing the area of the first conductivity type electric charge transferring region from being reduced due to impurities that enter by the thermal diffusion from the first conductivity type well region adjacent to the first conductivity type electric charge transferring region.

Advantageous Effects of Invention

According to the present invention as described above, damage due to etching and ion implantation can be lightened in a region for forming a photoelectric conversion element and a peripheral region thereof of a semiconductor substrate, and thereby the generation of noise electric charges can be suppressed so that an impurity concentration can be reduced in an electric charge transferring path from a photoelectric conversion element to an electric charge accumulating section in the semiconductor substrate. As a result, a solid-state imaging apparatus capable of suppression of noise electric charges and securing of the amount of saturation charges compatible with each other, a driving method for such a solid-state imaging apparatus; a manufacturing method for such a solid-state imaging apparatus, and an electronic information device equipped with such a solid-state imaging apparatus, can be realized.

BRIEF DESCRIPTION OF DRAWINGS

FIG. 1(b) illustrates circuits that constitute a pixel in the solid-state imaging apparatus.

FIG. 2(a) illustrates a disposition of an impurity implantation region with respect to an element separating region. FIG. 2(b) illustrates a disposition of a gate electrode of a transfer transistor and a contact section with respect to an element separating region.

FIG. 4(a) illustrates a potential distribution during an electric charge accumulating period in a path from a light entering surface of a semiconductor substrate through a photoelectric conversion element to a signal charge accumulating section, and FIG. 4(b) illustrates a potential distribution during a signal charge transferring period in the path.

FIGS. 5(a) to 5(f) illustrate cross sectional structures of a solid-state imaging apparatus in major steps of this manufacturing method.

FIG. 6(a) illustrates a disposition of an impurity implantation region with respect to an element separating region and FIG. 6(b) illustrates a disposition of a contact section and a gate electrode of a transfer transistor with respect to an element separating region.

FIG. 9(b) illustrates a circuit configuration of a unit pixel in the CMOS image sensor.

DESCRIPTION OF EMBODIMENTS

Hereinafter, embodiments of the present invention will be described with reference to accompanying drawings.
(Embodiment 1)

Figure 1:
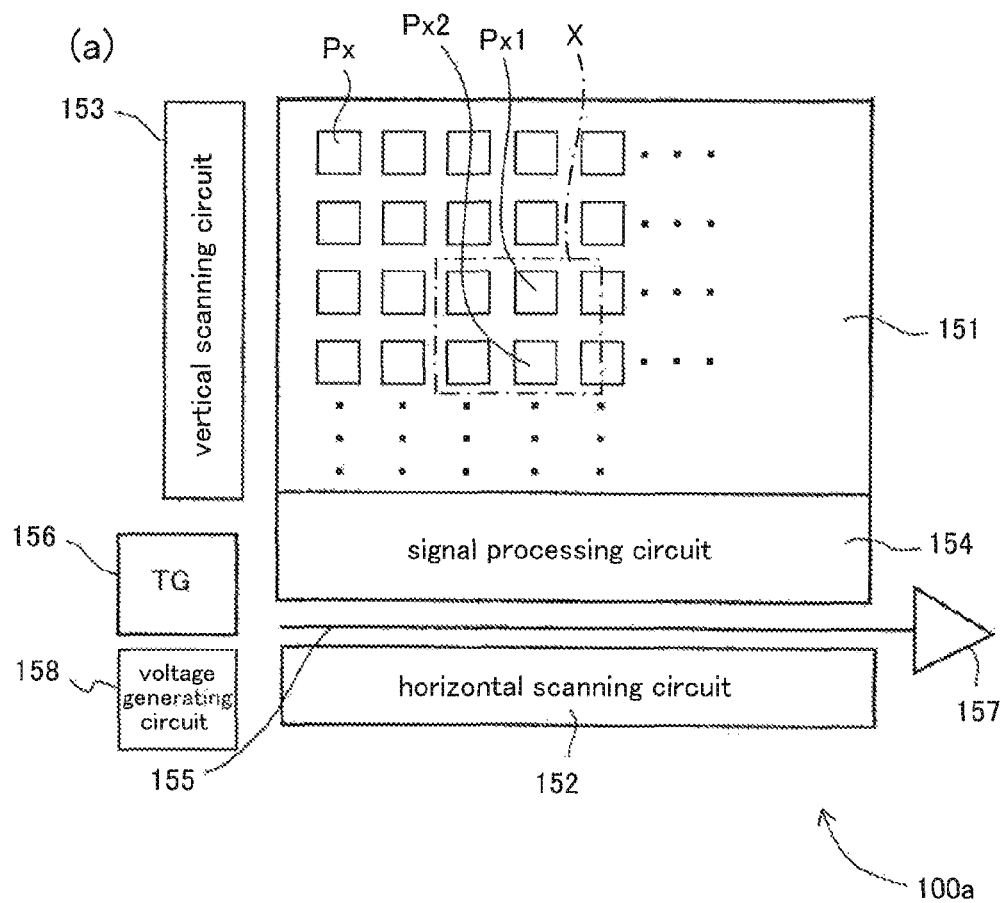
FIG. 1 is a diagram for describing a solid-state imaging apparatus according to Embodiment 1 of the present invention, where FIG. 1(a) schematically illustrates an overall configuration of the solid-state imaging apparatus.
Figure 1:
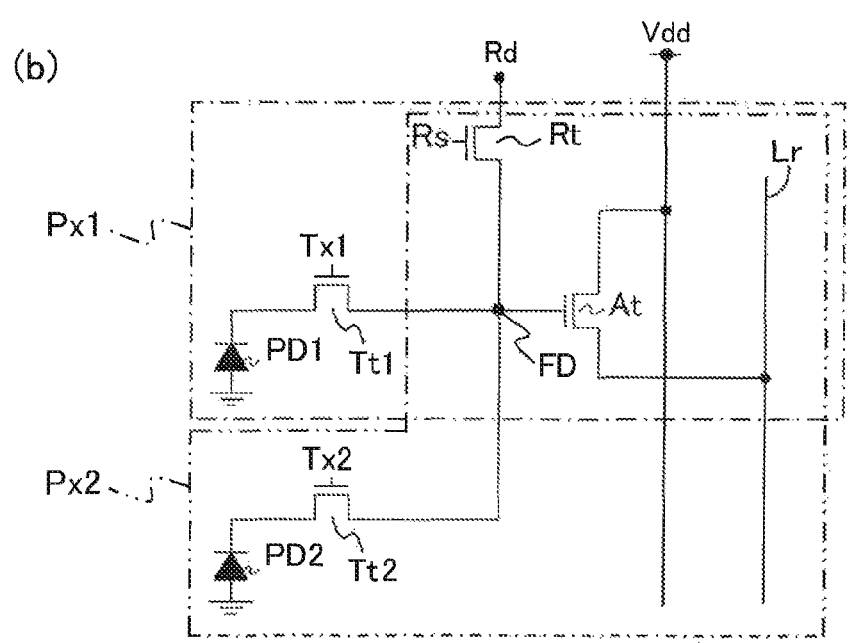

FIG. 1 is a diagram for describing a solid-state imaging apparatus according to Embodiment 1 of the present invention. FIG. 1(a) schematically illustrates an overall configuration of the solid-state imaging apparatus. FIG. 1(b) illustrates circuits that constitute a pixel in the solid-state imaging apparatus.

A solid-state imaging apparatus 100a according to Embodiment 1 comprises: a pixel section 151 comprising a plurality of pixels arranged in rows and columns; a vertical scanning circuit 153 for selecting a pixel row, which is a pixel arrangement in the horizontal direction in the pixel section 151; and a signal processing circuit 154 comprising an AD conversion section (ADC) for converting analog pixel signals from each of the pixels in a selected pixel row into digital pixel signals by signal processing and retaining the digital pixel signals. The solid-state imaging apparatus 100a comprises: a horizontal scanning circuit 152 for outputting a scanning signal to the signal processing circuit 154 so that the signal processing circuit 154 will successively output a digital pixel signal, for each pixel to a horizontal signal line 155; and an output section 157 for outputting the digital pixel signal outputted to the horizontal signal line 155 to the outside of the solid-state imaging apparatus 100a. The solid-state imaging apparatus 100a further comprises: a timing generating section 156 for supplying a timing signal to the vertical scanning circuit 153, the horizontal scanning circuit 152 and the signal processing circuit 154; and a voltage generating circuit 158 for generating negative voltage.

Here, the pixel section 151 is configured on a first conductivity type semiconductor substrate (hereinafter, simply referred to as a semiconductor substrate). The vertical scanning circuit 153, the horizontal scanning circuit 152, the signal processing circuit 154, the timing generating section 156 and the voltage generating circuit 158 are disposed in the peripheral region of the pixel region, in which the pixel section 151 is disposed, of the semiconductor substrate. These circuits and sections constitute a peripheral circuit section for converting an analog pixel signal into a digital pixel signal and outputting the digital pixel signal as an image signal, where the analog pixel signal is a signal charge generated by photoelectric conversion of incident light at a photoelectric conversion element that constitutes each pixel of the pixel section. Note that the voltage generating circuit 158 generates negative voltage here. However, the voltage generated by the voltage generating circuit 158 is not limited to negative voltage.

Figure 9:
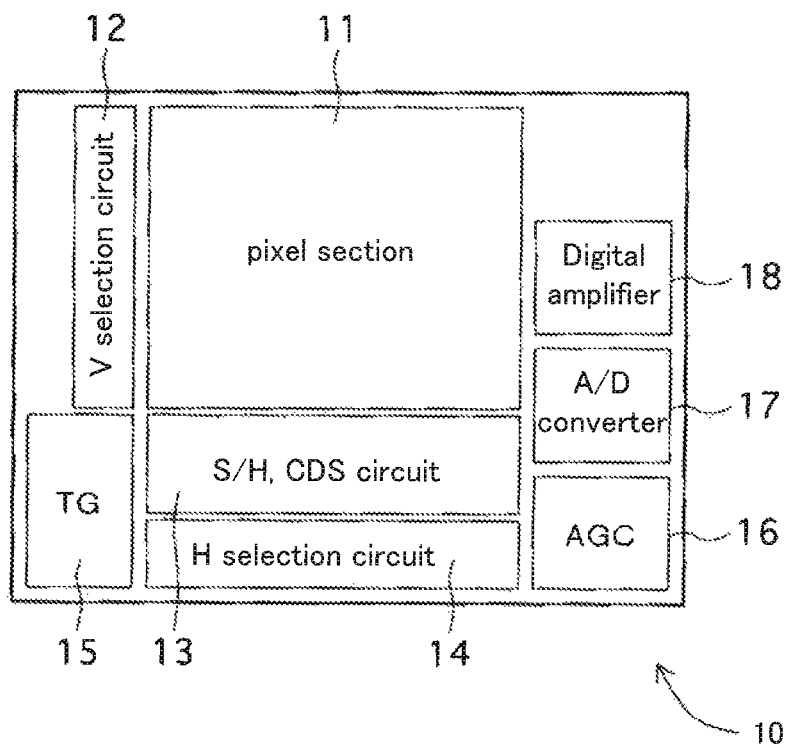
FIG. 9 is a diagram for describing a back side illumination type CMOS image sensor disclosed in Patent Literature 1, where FIG. 9(a) schematically illustrates an overall configuration of the CMOS image sensor
Figure 9:
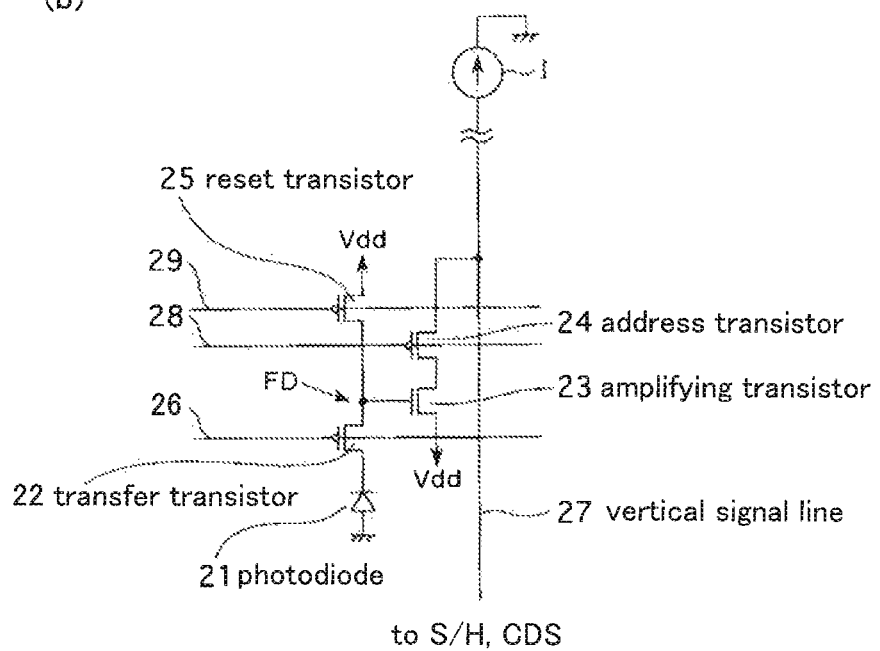
Figure 10:
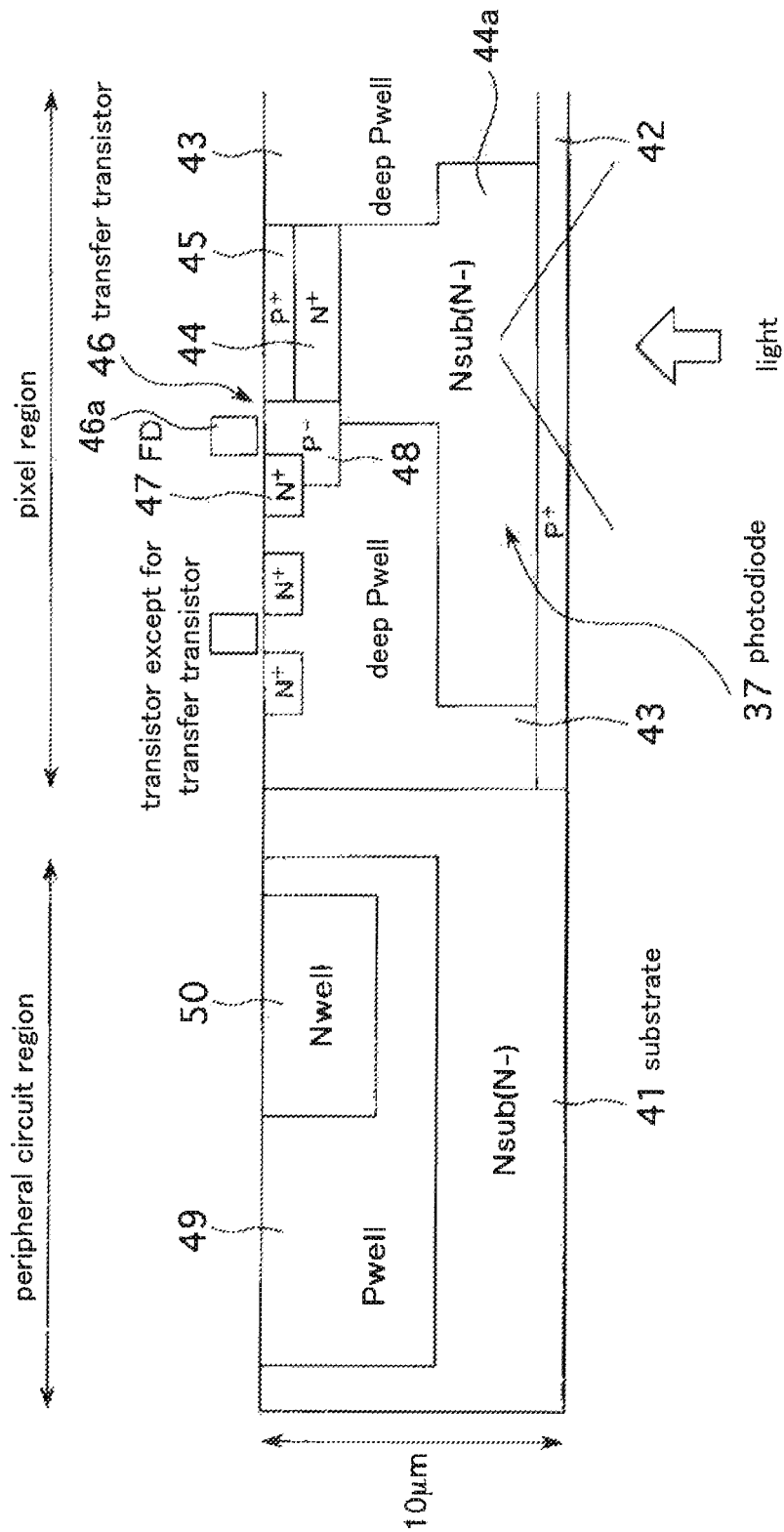
FIG. 10 is a diagram for illustrating a cross sectional structure of a pixel region and a peripheral circuit region of a semiconductor substrate that constitutes the CMOS image sensor illustrated in FIG. 9.

While the overall configuration of the solid-state imaging apparatus 100a is similar to that of a typical CMOS solid-state imaging apparatus, the solid-state imaging apparatus 100a according to Embodiment 1 is obtained by modifying the configuration of the pixel section 11 in the conventional solid-state imaging apparatus 10 illustrated in FIGS. 9 and 10. Specifically, the planar shape of the transfer gate electrode is modified, so that the impurity concentration of the front surface P layer of the photoelectric conversion element (photodiode) is reduced.

While the conventional solid-state imaging apparatus 10 comprises pixels that have a four transistor configuration with a transfer transistor, a reset transistor, an amplifying transistor, and an address transistor (selection transistor), the solid-state imaging apparatus according to Embodiment 1 of the present invention comprises pixels that have a three transistor configuration with a transfer transistor, a reset transistor, and an amplifying transistor. However, it is needless to say that the solid-state imaging apparatus according to Embodiment 1 of the present invention may comprise pixels that have a four transistor configuration, instead of the three transistor configuration.

As illustrated in FIG. 1(a), a plurality of pixels Px are arranged in rows and columns in the pixel section 151. Here, for convenience of explanation, the pixels in the pixel section 151 in the fourth column from the left of the figure and in the third and fourth rows from the top of the figure will be particularly referred to as pixels Px1 and Px2, and the specific pixel configuration will be described hereinafter.

First, the circuit configuration of the pixel illustrated in FIG. 1(b) will be described.

The pixel Px1 comprises: a photoelectric conversion element PD1 for generating a signal charge by photoelectric conversion on incident light; a transfer transistor Tt1 for transferring the signal charge generated by the photoelectric conversion element PD1 to a signal charge accumulating section FD outside the photoelectric conversion element on the basis of a transfer signal Tx1; a reset transistor Rt for resetting the signal charge of the signal charge accumulating section FD on the basis of a reset signal Rs; and an amplifying transistor At for amplifying signal voltage generated in accordance with signal charges accumulated in the signal charge accumulating section FD, and outputting the signal voltage to a reading signal line Lr.

The pixel Px2 comprises: a photoelectric conversion element PD2 for generating a signal charge by photoelectric conversion on incident light; a transfer transistor Tt2 for transferring the signal charge generated by the photoelectric conversion element PD2 to a signal charge accumulating section FD outside the photoelectric conversion element on the basis of a transfer signal Tx2; a reset transistor Rt for resetting the signal charge of the signal charge accumulating section FD on the basis of a reset signal Rs; and an amplifying transistor At for amplifying signal voltage generated in accordance with signal charges accumulated in the signal charge accumulating section FD, and outputting the signal voltage to a reading signal line Lr.

Specifically, in the pixel section 151, the circuit constituting the pixel Px has a two-pixel sharing configuration, in which two pixels positioned adjacent to each other top and bottom (e.g., pixel Px1 and pixel Px2 illustrated in FIGS. 1(a) and 1(b)) share a reset transistor Rt and an amplifying transistor At.

Here, the reset transistor Rt is connected in between a drain signal line Rd and a signal charge accumulating section FD, and the signal charge accumulating section FD is connected with a gate electrode of the amplifying transistor At. Further, a transfer transistor Tt1 and a photoelectric conversion element PD1 are connected in series in between the signal charge accumulating section FD and a grounding node. Similarly, a transfer transistor Tt2 and a photoelectric conversion element PD2 are connected in series. Further, the photoelectric conversion elements PD1 and PD2 are configured with photodiodes.

Next, a detailed structure of a pixel section in a solid-state imaging apparatus according to Embodiment 1 will be described with reference to FIGS. 2 and 3.

Figure 2:
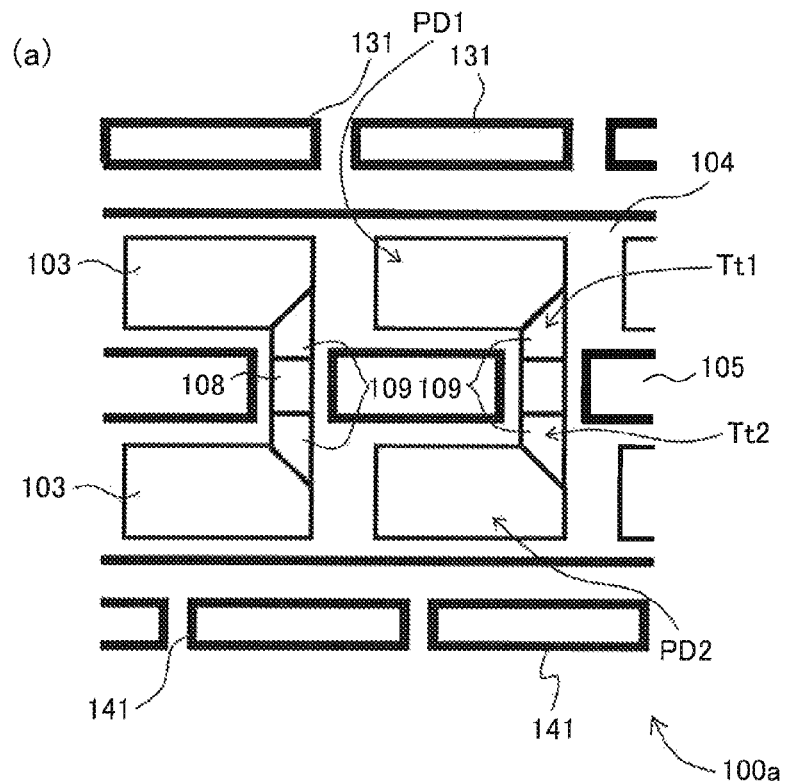
FIG. 2 is a planer view for describing a solid-state imaging apparatus according to Embodiment 1 of the present invention, where
Figure 2:
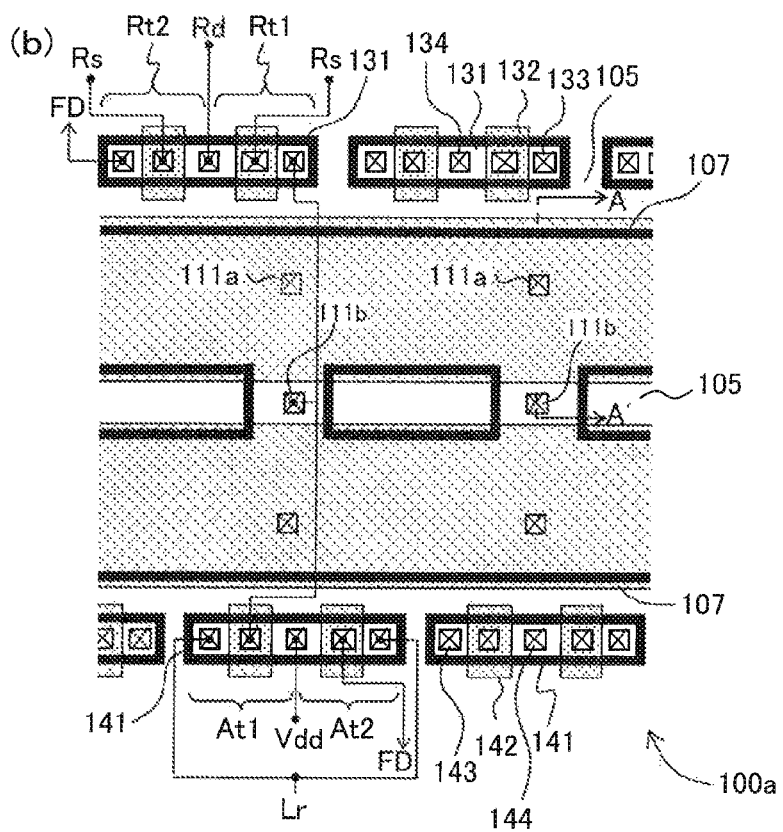

FIG. 2 is a planer view for describing a solid-state imaging apparatus according to Embodiment 1 of the present invention. FIG. 2(a) illustrates a disposition of an impurity implantation region with respect to an element separating region. FIG. 2(b) illustrates a disposition of a gate electrode of a transfer transistor and a contact section with respect to the element separating region.

Figure 3:
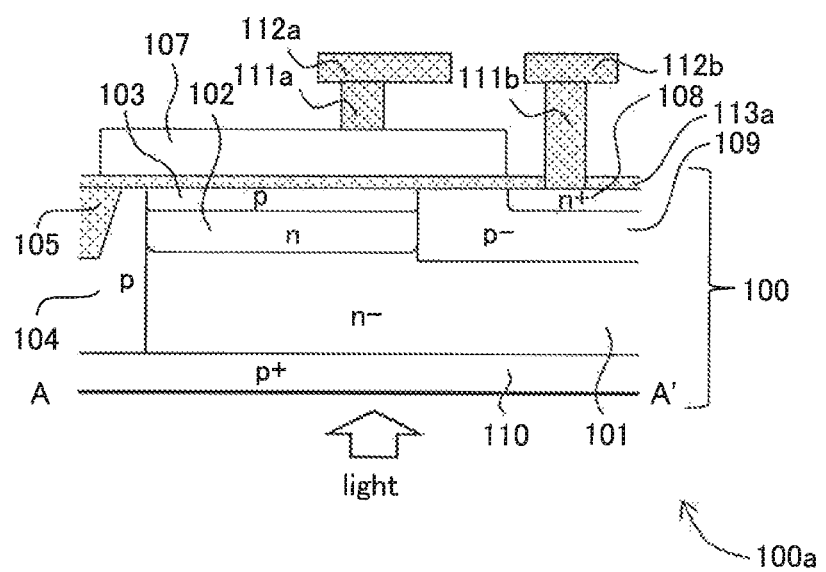
FIG. 3 is a diagram for describing a solid-state imaging apparatus according to Embodiment 1 of the present invention, where it illustrates a cross sectional view along the line A-A' in FIG. 2(b).

FIG. 3 is a cross sectional view along the line A-A' in FIG. 2(b), The planer view of FIG. 2(b) illustrates the disposition of various impurity implantation regions that appear on the semiconductor substrate, with regard to the part X surrounded by the alternate long and short dash line of the pixel section 151 illustrated in FIG. 1(a).

In the solid-state imaging apparatus 100a according to Embodiment 1 of the present invention, respective pixels Px, such as pixels Px1 and Px2, that configure the pixel section 151 formed on a first conductivity type semiconductor substrate 100, such as a p-type silicon substrate, are formed within the semiconductor substrate 100; and comprise photoelectric conversion elements (i.e., photodiodes) PD1 and PD2 for generating a signal charge by photoelectric conversion of incident light, and transfer transistors Tt1 and Tt2 formed on a first main surface of the semiconductor substrate 100, for transferring the signal charge generated by the photoelectric conversion elements PD1 and PD2, are comprised. The first main surface described above is the upper surface of the semiconductor substrate 100 (hereinafter, also referred to as a front substrate surface) in FIG. 3, and FIG. 3 illustrates the structure of the transfer transistor Tt1 of the pixel Px1 as well as the photoelectric conversion element PD1 and a signal charge accumulating section 108 (FD in FIG. 1(b)) that are positioned on either side of the transfer transistor Tt1. Note that while FIG. 3 illustrates a cross sectional structure of the pixel Px1, other pixels Px are identical to this pixel Px1.

Here, the photoelectric conversion element PD1 of the pixel Px1 comprises: a second conductivity type photoelectric conversion region (n⁻ type semiconductor region) 101 for photoelectrically converting incident light, which has entered a second main surface of the semiconductor substrate that is opposite from the first main surface; a second conductivity type electric charge accumulating region (n type semiconductor region) 102 for accumulating a signal charge generated by photoelectric conversion at the photoelectric conversion region 101, on the first main surface side of the semiconductor substrate 100; and a back surface p⁺ region 110. A gate electrode 107 (hereinafter, also referred to as a transfer gate electrode) of the transfer transistor is formed to be disposed over the surface on the first main surface side of the electric charge accumulating region 102. Here, the second main surface is a lower surface (hereinafter, also referred to as a back substrate surface) of the semiconductor substrate 100 in FIG. 3.

Further, in the solid-state imaging apparatus 100a, the photoelectric conversion element PD1 comprises a first conductivity type front surface semiconductor region (front surface p region) 103 formed on the substrate front surface side of the second conductivity type electric charge accumulating region 102 for covering the electric charge accumulating region 102. Further, the pixel Px1 comprises: a second conductivity type signal charge accumulating section (electric charge accumulating n⁺ region) 108 for accumulating a signal charge generated by the photoelectric conversion element PD1; and a first conductivity type electric charge transferring region (electric charge transfer section p⁻ region) 109 disposed in between the signal charge accumulating section 108 outside the photoelectric conversion element and the electric charge accumulating region 102 of the photoelectric conversion element for transferring the signal charge from the electric charge accumulating region 102 of the photoelectric conversion element PD1 to the signal charge accumulating section 108 outside the photoelectric conversion element. The first conductivity type electric charge transferring region (electric charge transfer section p⁺ region) 109 comprises a channel region of the transfer transistor Tt1. The front surface p region 103 has an impurity concentration that exceeds the impurity concentration of the electric charge transfer section p⁻ region 109.

Here, the second conductivity type electric charge accumulating region (n type semiconductor region) 102 and the second conductivity type signal charge accumulating section (electric charge accumulating n⁺ region) 108 are disposed away from each other, with the first conductivity type electric charge transferring region (electric charge transfer section p⁻ region) 109 interposed therebetween. The lower limit of the space between the electric charge accumulating region 102 and the signal charge accumulating section 108 may be equal to or greater than a minimum distance that does not substantially cause a short channel effect. Further, the upper limit of the space between the electric charge accumulating region 102 and the signal charge accumulating section 108 may be equal to or smaller than a permissible maximum distance that is determined by the degree of integration of pixels in the solid-state imaging apparatus. Specifically, as long as the space between the electric charge accumulating region 102 and the signal charge accumulating section 108 is equal to or greater than a minimum distance that does not substantially cause a short channel effect, and is equal to or smaller than a permissible maximum distance that is determined by the degree of integration of pixels in the solid-state imaging apparatus, it is within the range of the present invention. The space between the electric charge accumulating region 102 and the signal charge accumulating section 108 is within the range of 0.2 µm to 1.0 µm, for example. This is because, in the existing circumstances, the minimum distance that does not cause a short channel effect is 0.2 µm and the permissible maximum distance that is determined by the degree of integration of pixels in the solid-state imaging apparatus is 1.0 µm.

However, owing to the progress in fine processing techniques, the lower limit of the space described above has a tendency to be smaller than the current lower limit. Thus, in the future, the lower limit of the space described above may be smaller than the current value, 0.2 µm (e.g., 0.1 µm).

Either way, as long as the space between the electric charge accumulating region 102 and the signal charge accumulating section 108 is equal to or greater than a minimum distance that does not substantially cause a short channel effect, and is equal to or smaller than a permissible maximum distance that is determined by the degree of integration of pixels in the solid-state imaging apparatus, it is within the range of the present invention, as described above.

Further, the second conductivity type electric charge accumulating region 102, the first conductivity type electric charge transferring region 109 and the second conductivity type signal charge accumulating section 108 are surrounded by a first conductivity type well region 104 formed in the semiconductor substrate 100. The second conductivity type electric charge accumulating region 102, the first conductivity type electric charge transferring region 109 and the second conductivity type signal charge accumulating section 108 are electrically separated from one another by the first conductivity type well region 104 for each two pixels that share the same second conductivity type signal charge accumulating section 108.

Further, the front surface p region 103 has an impurity concentration that is equal to or smaller than the impurity concentration of the first conductivity type well region 104. By setting the impurity concentration of the first conductivity type well region 104 to be $1 \times 10^{18}$ cm$^{-3}$ or smaller, the ion implantation damage to the well region 104 can be reduced and thus the generation of noise electric charges can be suppressed.

Further, the first conductivity type front surface semiconductor region 103 is configured with a p type semiconductor layer of 0.1 µm to 0.3 µm in thickness, and the second conductivity type electric charge accumulating region 102, which constitutes the photoelectric conversion element, is formed such that the peak position of its impurity concentration is at a position 0.15 µm to 0.40 µm in depth from the first main surface of the semiconductor substrate.

Further, an element separating region 105 is positioned in between the photoelectric conversion elements PD1 and PD2 that are adjacent to each other top and bottom, and the element separating region 105 is also positioned in between second conductivity type signal charge accumulating sections 108 that are arranged in the horizontal direction in the same pitch as the arrangement pitch of the photoelectric conversion elements. Further, by the element separating region 105, two columns of top and bottom arrangement regions for photoelectric conversion elements, in which photoelectric conversion elements are arranged, are also electrically separated from belt-shaped diffusion regions 131 and 141 for the reset transistor Rt and amplification transistor At.

The element separating region 105 is such a region that is made by filing an insulating member, such as silicon oxide, into a trench formed in the semiconductor substrate 100. Further, the back surface p$^+$ region 110 is formed on the back surface side of the semiconductor substrate 100.

The connection of transistors in a circuit that constitutes a pixel will be described with reference to FIGS. 2 and 3.

In order to avoid complicity, FIG. 2(a) and FIG. 2(b) illustrate the connection between transistors in photoelectric conversion elements located on the left side of the photoelectric conversion elements PD1 and PD2 in the figure, while the connection between transistors in the photoelectric conversion elements PD1 and PD2 is the same as that in the photoelectric conversion elements located on the left side of the photoelectric conversion elements PD1 and PD2 in the figures.

Two reset transistors Rt1 and Rt2 are formed on the belt-shaped diffusion region 131, and two reset gate electrodes 132 to which a reset signal Rs is applied are disposed in such a manner to intersect with the belt-shaped diffusion region 131, with a gate insulation film (not shown) interposed therebetween. A drain signal Rd for row selection is applied through a contact section 134 to a common drain region between the two reset gate electrodes 132 in the belt-shaped diffusion region 131. Further, the source region of one of the reset transistors, i.e., reset transistor Rt1, is connected with wiring 112b that is connected with the signal charge accumulating section (FD section) 108, with a contact section 133 interposed therebetween. The source region of the other reset transistor, i.e., reset transistor Rt2, is connected with a signal charge accumulating section (FD section) common to the pixel in the first row and the pixel in the second row in the pixel section 151 illustrated in FIG. 1.

Two amplifying transistors At1 and At2 are formed on the belt-shaped diffusion region 141, and an amplifying gate electrode 142 is disposed in such a manner to intersect with the belt-shaped diffusion region 141, with a gate insulation film (not shown) interposed therebetween. A power source voltage Vdd (e.g., 2.5V) is applied through a contact section 144 to a common drain region between the two amplifying gate electrodes 142 in the belt-shaped diffusion region 141. Further, the source region of one of the amplifying transistors, i.e., amplifying transistor At1, is connected with a reading signal line Lr with a contact section 143 interposed therebetween. The source region of the other amplifying transistor, i.e., amplifying transistor At2, is also connected with the reading signal line Lr corresponding to the same pixel column, with the contact section 143 interposed therebetween. Further, the gate electrode 142 of one of the amplifying transistors, i.e., amplifying transistor At1, is connected with wiring 112b that is connected with the signal charge accumulating section (FD section) 108. The gate electrode 142 of the other amplifying transistor, i.e., amplifying transistor At2, is connected with a signal charge accumulating section (FD section) common to the pixel in the fifth row and the pixel in the sixth row of the pixel section 151 illustrated in FIG. 1.

Further, the transfer gate electrode 107 is connected with a wiring layer 112a with a contact section 111a interposed therebetween. Further, the signal charge accumulating section (Floating Diffusion section) 108 is connected with a wiring layer 112b with the contact section 111b interposed therebetween. Here, the wiring layers 112a and 112b are formed by patterning a wiring material formed above the transfer gate electrode 107 with an interlayer insulation film (not shown) interposed therebetween.

Hereinafter, impurity concentrations of semiconductor substrates and the respective semiconductor regions constituting the solid-state imaging apparatus according to the present invention will be described.

The impurity concentration of the second conductivity type photoelectric conversion region (n⁻ type semiconductor region) 101 constituting a photodiode is $1\times10^{15}$ cm$^{-3}$ to $5\times10^{16}$ cm$^{-3}$. The impurity concentration of the n-type electric charge accumulating region 102 constituting a photodiode is $1\times10^{16}$ cm$^{-3}$ to $1\times10^{17}$ cm$^{-3}$. Further, the impurity concentration of the front surface p region 103 formed on the front surface of the second conductivity type electric charge accumulating region (n type semiconductor region) 102 is $1\times10^{16}$ cm$^{-3}$ to $5\times10^{17}$ cm$^{-3}$, and the impurity concentration of the first conductivity type well region (p well region) 104 is $5\times10^{16}$ cm$^{-3}$ to $1\times10^{18}$ cm$^{-3}$. Further, the impurity concentration of a second conductivity type signal charge accumulating section, i.e., FD (Floating Diffusion) section 108 is $1\times10^{17}$ cm$^{-3}$ to $1\times10^{20}$ cm$^{-3}$, and the impurity concentration of the electric charge transfer section p region 109 is $5\times10^{15}$ cm$^{-3}$ to $1\times10^{17}$ cm$^{-3}$, and the impurity concentration of the back surface p⁺ region 110 is $1\times10^{18}$ cm$^{-3}$ to $1\times10^{19}$ cm$^{-3}$.

Next, the operation of the solid-state imaging apparatus according to Embodiment 1 of the present invention will be described hereinafter.

In such a solid-state imaging apparatus 100 according to Embodiment 1 of the present invention that has a configuration as described above, the reading operation is performed in a similar manner as the conventional solid-state imaging apparatus illustrated in FIG. 9.

Hereinafter, a reading operation in the solid-state imaging apparatus according to Embodiment 1 will be briefly described with reference to FIGS. 1(a) and 1(b).

The vertical scanning circuit 153 selects a pixel row in the pixel section by a timing signal from the timing generating section 156, and a pixel signal of the selected pixel row is outputted to the signal processing circuit 154. In the signal processing circuit 154, a process for removing a fixed noise pattern is performed. Further, as the horizontal scanning circuit 152 outputs a scanning signal, by the timing signal from the timing generating section 156, to the signal processing circuit 154 so that the signal processing circuit 154 will outputs a digital pixel signal of each pixel successfully to the horizontal signal line 155, the digital signal outputted to the horizontal signal line 155 is outputted outside the solid-state imaging apparatus 100a from the output section 157.

Further, in the solid-state imaging apparatus according to Embodiment 1, during an electric charge accumulating period during which signal charges are generated and accumulated by the photoelectric conversion of incident light at the photoelectric conversion element, 0.1 V to 1.0 V of electrical potential is applied between the transfer gate electrode 107 and the first conductivity type front surface semiconductor region 103 so that the electric potential of the transfer gate electrode 107 will be smaller than that of the first conductivity type front surface semiconductor region 103.

Figure 4:
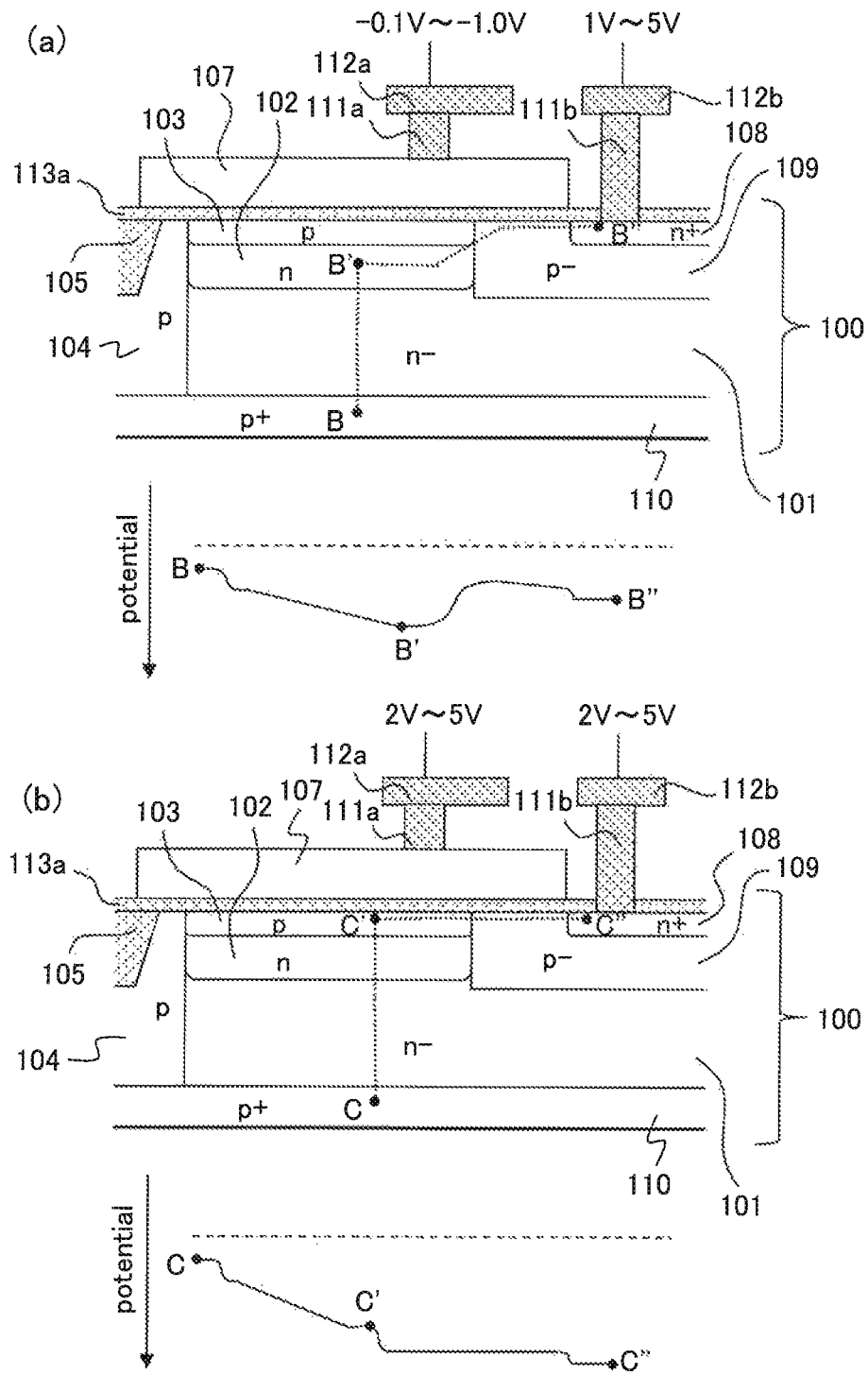
FIG. 4 is a diagram for describing an operation of a solid-state imaging apparatus according to Embodiment 1 of the present invention, where

FIG. 4 is a diagram illustrating an operation of such a solid-state imaging apparatus.

For example, in the solid-state imaging apparatus 100a, 0.1 V to 1.0 V of negative voltage is generated and applied to the transfer gate electrode 107 during the electric charge accumulating period by a voltage generating circuit 158, which is one of the peripheral circuit sections disposed on the first main surface side of the semiconductor substrate so as to be positioned in the periphery of the pixel section. Further, the electric potential of the first conductivity type front surface semiconductor region 103 in the pixel section is fixed to the grounding electric potential of the peripheral circuit sections except for the pixel section 151, through the first conductivity type well region 104, first conductivity type back surface semiconductor region 110 and the like.

FIG. 4(a) illustrates a potential distribution of a period during which photoelectric conversion is performed and signal charges are accumulated.

Voltage of 1 V to 5 V is applied to the signal charge accumulating section 108 (FD section) and negative electric potential within the range between 0.1 V and 1.0 V set with respect to the grounding electric potential is provided to the transfer gate electrode 107, so that the electric potential of the electric charge accumulating region 102 will be fixed in such a manner that the hole concentration will be stabilized on the front surface thereof, and the generation of noise electric charges will be suppressed. Further, excess electric charges accumulated in the electric charge accumulating region 102 are drained to the signal charge accumulating section (FD section) 108 by the potential gradient in the path illustrated as B-B'-B" in FIG. 4(a).

Further, during an electric charge transferring period during which signal charges accumulated in the photoelectric conversion element during the electric charge accumulating period are transferred to the signal charge accumulating section (FD section) 108, a positive electric potential difference is applied between the transfer gate electrode 107 and the first conductivity type front surface semiconductor region 103 so that the electric potential of the transfer gate electrode 107 will be greater than that of the first conductivity type front surface semiconductor region 103.

FIG. 4(b) illustrates a potential distribution of a period during which signal charges are transferred.

Power source voltage within the range between 2 V and 5 V is applied to the transfer gate electrode 107 and the signal charge accumulating section 108, so that the potential of the front surface p region 103 and the electric charge accumulating region 102 will be modulated, and signal charges gathered in the electric charge accumulating region 102 will be read out to the FD section 108, following the potential gradient in the path illustrated as C-C'-C" in FIG. 4(b).

As such, by applying an electric potential during the electric charge accumulating period between the transfer gate electrode 107 and the first conductivity type front surface semiconductor region 103 so that the electric potential of the transfer gate electrode 107 will be smaller than that of the first conductivity type front surface semiconductor region 103, a stable hole concentration can be secured in the first conductivity type front surface semiconductor region 103, thereby shortening the life span of thermally generated carriers (electrons) and reducing noise electric charges.

Next, a method for manufacturing a solid-state imaging apparatus according to Embodiment 1 of the present invention will be described hereinafter.

Figure 5:
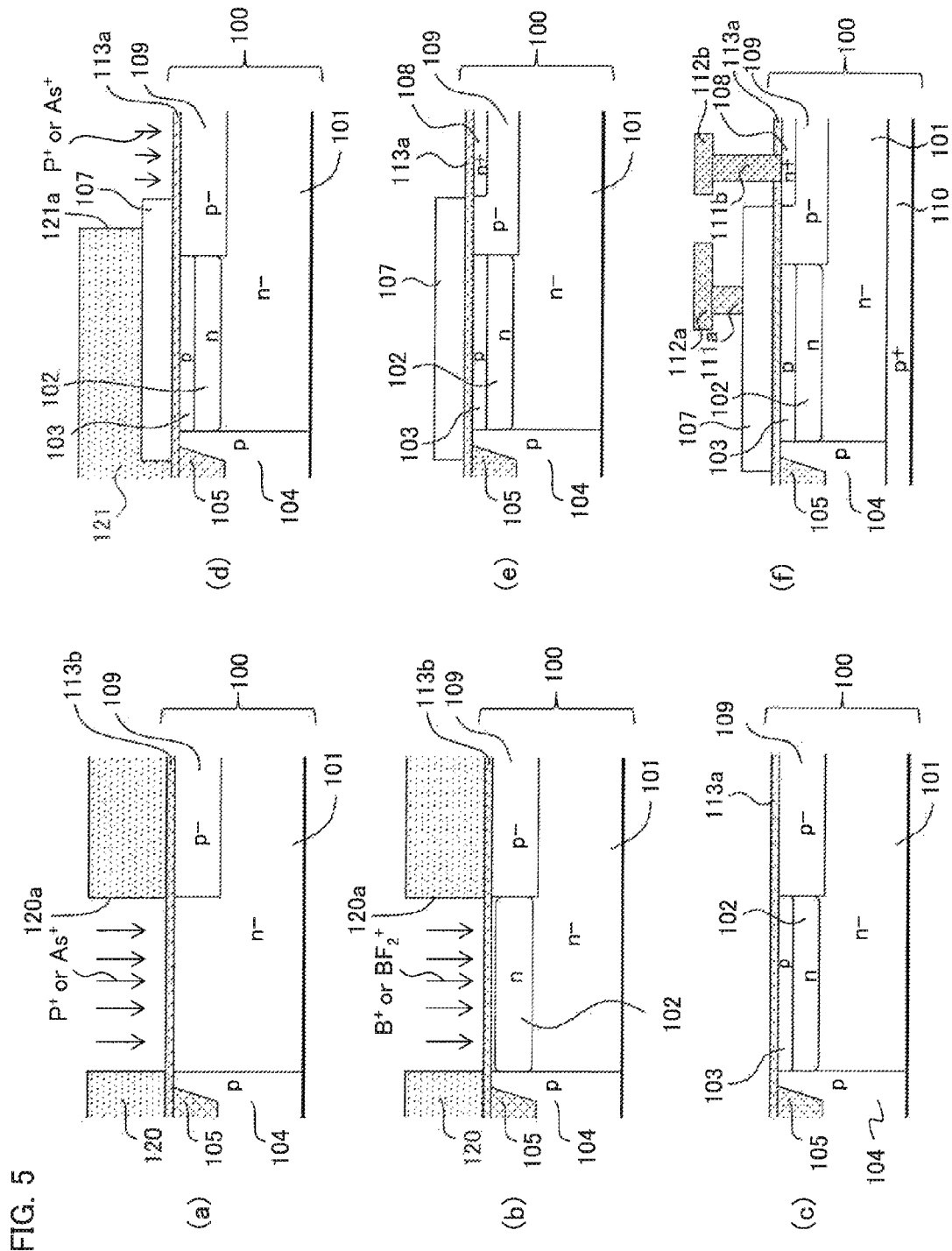
FIG. 5 is a diagram for describing a method for manufacturing a solid-state imaging apparatus according to Embodiment 1 of the present invention, where

FIG. 5 is a diagram for describing a method for manufacturing a solid-state imaging apparatus according to Embodiment 1 of the present invention. FIGS. 5(a) to 5(f) illustrate cross sectional structures of a solid-state imaging apparatus in major steps of this manufacturing method.

First, an element separating region 105 is formed on a first conductivity type semiconductor substrate (e.g., p type silicon substrate) 100. The element separating region 105 is formed by forming a trench in the front surface of the p-type silicon substrate 100 and filling the trench with an insulating material such as an oxide. In FIG. 2(a), the thick solid line indicates the border of the element separating region.

Thereafter, a p-well region 104 is formed in the p-type silicon substrate 100, and an n⁻ type semiconductor region 101 is formed in the p-well region 104 as a second conductivity type photoelectric conversion region of a photodiode. Further, an electric charge transfer section p⁻ region 109 is formed in the front surface region of the n⁻ type semiconductor region 101.

Next, an ion implantation protective film 113b is formed, and thereafter, n-type impurities, such as phosphor (p⁺) or arsenic (As⁺), are selectively implanted using a resist mask 120 with an opening 120a as illustrated in FIG. 5(a). As a result, an n-type semiconductor region 102 is formed as a second conductivity type electric charge accumulating region constituting a photodiode that functions as a photoelectric conversion element (FIG. 5(b)).

Subsequently, as illustrated in FIG. 5(b), p-type impurities, such as boron (B⁺) or BF₂⁺, are implanted using the same resist mask 120 to form a front surface p-region 103 as a first conductivity type front surface semiconductor region.

Next, as illustrated in FIG. 5(c), after the resist mask 120 is removed, a semiconductor region, constituting a semiconductor element, in the peripheral circuit section, is formed within the semiconductor substrate. Thereafter, the ion implantation protective film 113b is removed and a gate insulation film 113a is formed on the front surface. Further, an electrode material such as polysilicon is deposited by a CVD method or the like, and this electrode material is anisotropically etched by a technique of dry etching, such as plasma etching, to form a transfer gate electrode 107 (FIG. 5(d)).

At this stage, as illustrated in FIG. 5(d), the transfer gate electrode 107 is disposed over the surface on the substrate front surface side of the front surface p-region 103 and also over the surface on the substrate front surface side of the electric charge transfer section p⁻ region 109, except for the region for forming an electric charge accumulating n⁺ region 108.

Subsequently, n-type impurities, such as phosphor (p⁺) or arsenic (As⁺), are implanted into the opening of the transfer gate electrode 107, using a resist mask 121 with an opening 121a, to form a floating diffusion (FD) region (i.e., electric charge accumulating n⁺ region) 108, which will be an electric charge reading region (FIG. 5(e)).

Next, after an interlayer insulation film (not shown) is formed, contact sections 111a and 111b are formed, and wiring layers 112a and 112b are also formed. At this stage, contact sections 133, 134, 143 and 144 are formed, not only above the transfer gate electrode 107 and electric charge accumulating n⁺ region 108, but also above the gate electrode and source drain region of the reset transistor Rt and amplifying transistor At, to make connections between the source region of the reset transistor Rt and the electric charge accumulating n⁺ region 108, and between the gate electrode of the amplifying transistor At and the electric charge accumulating n⁺ region 108.

Further at this stage, semiconductor elements, such as a transistor, that constitute the peripheral circuit may be connected with each other by a wiring layer.

Thereafter, when the back surface side of the n⁻ type semiconductor region 101 is exposed as a light entering surface through a supporting substrate laminating step of laminating the p-type silicon substrate 100 described above with a supporting substrate as well as a silicon film thinning step of polishing the back surface side of the p-type silicon substrate 100 to make the p-type silicon substrate 100 thinner, a back surface p⁺ region 110 is formed by an impurity introducing and thermal processing step of introducing impurities to, and performing a thermal treatment on, the back surface of the n⁻ type semiconductor region 101 (FIG. 5(f)).

Next, the working effect of the solid-state imaging apparatus according to the present invention will be described hereinafter.

First, between a solid-state imaging apparatus 100a according to Embodiment 1 of the present invention and a comparative conventional solid-state imaging apparatus 10, the regions covered by the transfer gate electrodes are respectively different, as can be seen from the comparison between FIG. 3 and FIG. 10.

Specifically, in the solid-state imaging apparatus 100a according to Embodiment 1 of the present invention, the transfer gate electrode 107 is disposed, not only over the surface on the first main surface side of the first conductivity type electric charge transferring region (electric charge transfer section p region) 109 of each pixel, but also over the surface on the first main surface side of the second conductivity type electric charge accumulating region (n type semiconductor region) 102 of each pixel (FIG. 3), while in the conventional solid-state imaging apparatus 10, the gate electrode 46a of the transfer transistor 46 is formed only above the electric charge transfer p⁻ layer 48, and the gate electrode 46a of the transfer transistor 46 is not disposed over the surface on the substrate front surface side of the electric charge accumulating N⁺ region 44 that constitutes a photoelectric conversion element (i.e., photodiode) 37 (see FIG. 10).

Furthermore, between the solid-state imaging apparatus 100a according to Embodiment 1 of the present invention and the comparative conventional solid-state imaging apparatus 10, the impurity concentrations of the front surface p regions formed on the front surface side of the n-type electric charge accumulating region 102 are different, as can be seen from the comparison between FIG. 3 and FIG. 10. Specifically, in the solid-state imaging apparatus 100a according to Embodiment 1 of the present invention, the impurity concentration of the first conductivity type front surface semiconductor region (front surface p region) 103 formed on the front surface side of the n-type electric charge accumulating region 102 is equal to or smaller than the impurity concentration of the p-type well region 104, which is smaller than the impurity concentration of the front surface P⁺ layer 45 in the conventional solid-state imaging apparatus 10.

Specifically, the plasma damage due to the gate electrode etching to the front surface of the photoelectric conversion element as well as the ion implantation damage due to high concentration ion implantation for forming a front surface P+ layer 45 can be eliminated in the conventional structure illustrated in FIG. 10. As a result, in such a conventional structure, the impurity concentration of the front surface P+ layer 45 to be an embedded photodiode structure can be lowered and a rapid change in the impurity concentration in the transition region from the front surface P+ layer 45 to the electric charge transfer P− layer 48 can be eliminated. Thereby, the impurity concentration in the electric charge transferring region can be lowered and the suppression of noise electric charges and the securing of the amount of saturation charges can be made compatible with each other. Specifically, the elimination of the electric charge transferring region from the front surface P+ layer 45 to the electric charge transfer P− layer 48 facilitates the securing of transfer characteristics. By the covering of the front surface of the photodiode (photoelectric conversion element) by the transfer gate electrode as described above, the hole concentration is stably retained during electric charge accumulation and the influence on noise due to noise electric charges is suppressed.

In the solid-state imaging apparatus 100*a* according to Embodiment 1 as described above, the transfer gate electrode 107 is disposed over the surface on the first main surface side of the second conductivity type electric charge accumulating region (n type semiconductor region) 102 of the photoelectric conversion elements PD1 and PD2, so that the second conductivity type electric charge accumulating region (n type semiconductor region) 102 of the photoelectric conversion element and the front surface p-region 103 thereabove will not receive any damage from plasma etching in the process of forming the transfer gate electrode 107, thus suppressing the generation of noise electric charges due to crystal defects.

Accordingly, the generation of noise electric charges can be suppressed in the electric charge accumulating region 102 of the photoelectric conversion element. Thus, even if the impurity concentration is reduced in the first conductivity type front surface semiconductor region (front surface p-region) 103 formed in the front surface region of the electric charge accumulating region 102 of the photoelectric conversion element, the amount of noise electric charges generated can be suppressed. Thus, noise due to the noise electric charges will not be significant.

As a result, the impurity concentration of the first conductivity type electric charge transferring region 109, adjacent to the second conductivity type electric charge accumulating region 102 of this photodiode can be suppressed to be low. Accordingly, the amount of potential change in the first conductivity type electric charge transferring region 109 with respect to the change in the electric potential of the transfer gate electrode 107 can be greater, thereby increasing the efficiency in electric charge transferring.

Further, since the transfer gate electrode is disposed entirely over the exposed region, to the front surface of the semiconductor, of the p-well region (first conductivity type well region) 104 surrounding the second conductivity type electric charge accumulating region (n type semiconductor region) 102 of the photoelectric conversion element, the p-well region 104 does not receive any damage from plasma etching during the process of forming the transfer gate electrode, and the crystallinity of the p-well region can be favorable. Thus, the generation of noise electric charges due to crystal defects can be suppressed in the p-well region 104. By reducing the impurity concentration of the p-well region 104 accompanied by the suppressing, the ion implantation damage can be reduced, which can also suppress the generation of noise electric charges due to crystal defects or the like.

Further, since the impurity regions within the semiconductor substrate, except for the electric charge accumulating n+ region (FD section) 108, are all formed prior to the forming of the transfer gate electrode, the impurity regions within the semiconductor substrate, except for the FD section 108 will be formed without any damage received from plasma etching during the formation of the transfer gate electrode. This enables securing favorable crystallinity and eliminating causes of deterioration of the characteristics, such as leak current.

Further, by applying negative bias to the transfer gate electrode during electric charge accumulation, the hole concentration can be stably retained at the front surface p-region 103, and the reduction of the impurity concentration of the front surface p-region 103 can be achieved while suppressing the influence on noise due to noise electric charges.

(Embodiment 2)

Figure 6:
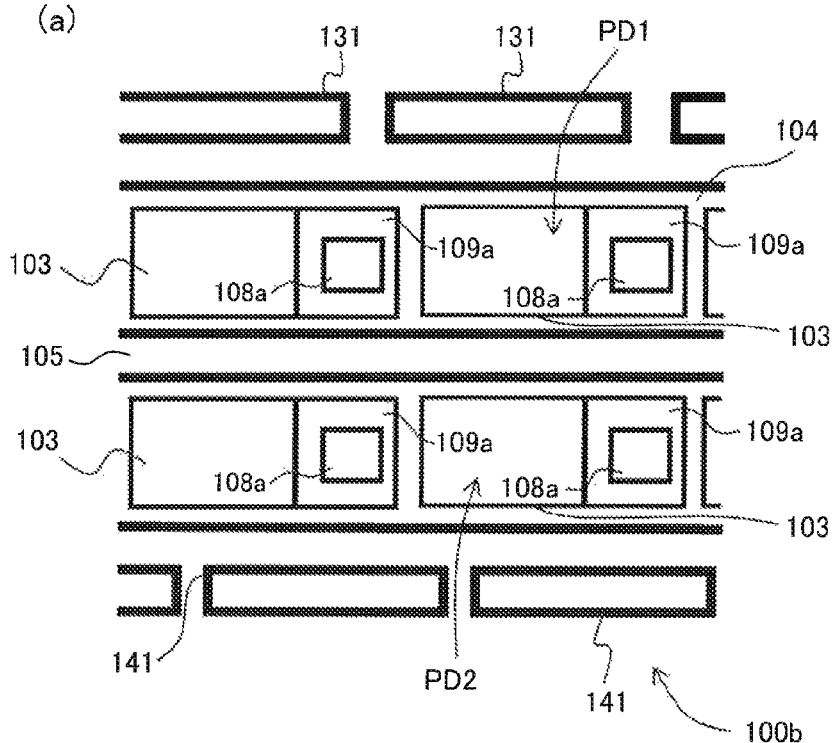
FIG. 6 is a plane view for describing a solid-state imaging apparatus according to Embodiment 2 of the present invention, where
Figure 6:
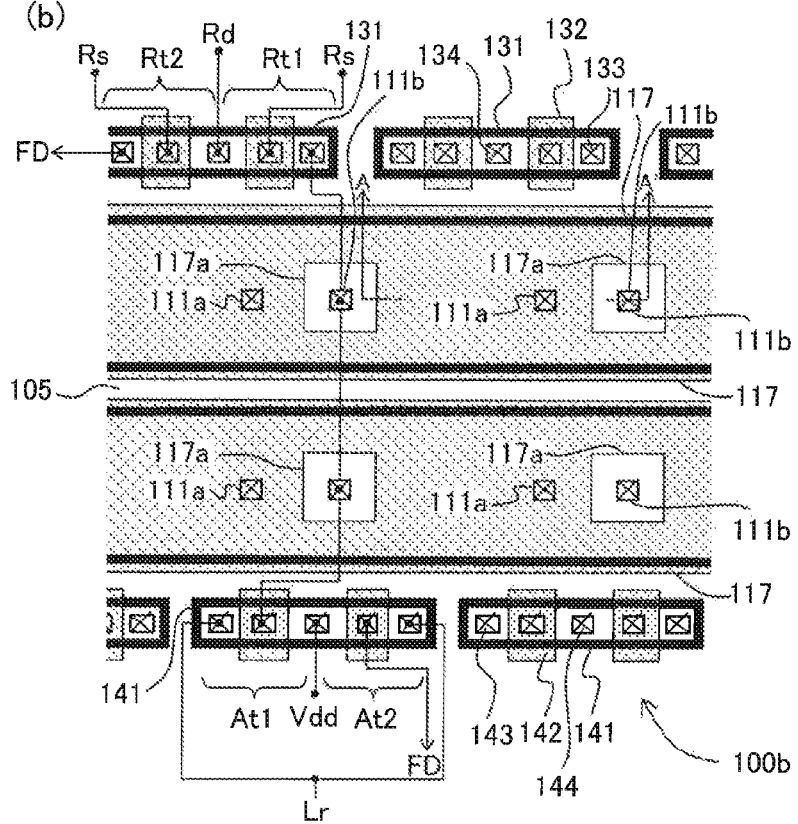
Figure 7:
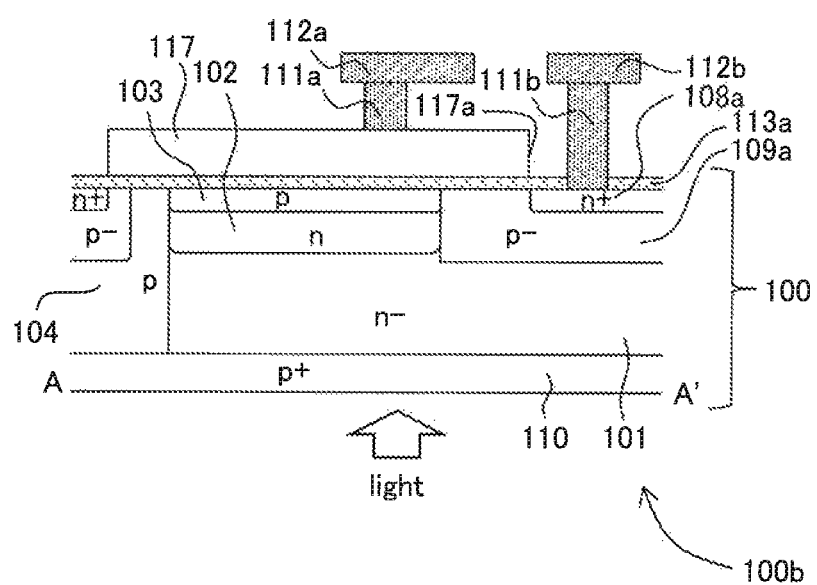
FIG. 7 illustrates a cross sectional view along the line A-A' in FIG. 6(b).

FIG. 6 is a plane view for describing a solid-state imaging apparatus according to Embodiment 2 of the present invention. FIG. 6(*a*) illustrates a disposition of an impurity implantation region relative to an element separating region. FIG. 6(*b*) illustrates a disposition of a gate electrode and a contact section of a transfer transistor relative to an element separating region. Further, FIG. 7 illustrates a cross sectional view along the line A-A' in FIG. 6(*b*).

A solid-state imaging apparatus 100*b* according to Embodiment 2 is a variation with regard to the disposition of the first conductivity type electric charge transferring region (electric charge transfer section p− region) 109 and the second conductivity type signal charge accumulating section (electric charge n+ region) 108 in the solid-state imaging apparatus 100 according to Embodiment 1.

Specifically, in the solid-state imaging apparatus 100*b* according to Embodiment 2, a second conductivity type signal charge accumulating section (electric charge n+ region) 108*a* is disposed in between adjacent first conductivity type electric charge accumulating regions 102 arranged in the row direction, and a first conductivity type electric charge transferring region 109*a* is disposed in between this second conductivity type signal charge accumulating section 108*a* and a corresponding first conductivity type electric charge accumulating region 102. Further, the first conductivity type electric charge transferring region 109*a* is disposed in such a manner to surround the second conductivity type signal charge accumulating section 108*a*.

The rest of the configuration is identical to that of the solid-state imaging apparatus according to Embodiment 1.

Also in the solid-state imaging apparatus 100*b* according to Embodiment 2, two reset transistors Rt1 and Rt2 are formed above a belt-shaped diffusion region 131, and two reset gate electrodes 132 to which a reset signal Rs is applied are disposed in such a manner to intersect with the belt-shaped diffusion region 131, with a gate insulation film (not shown) interposed therebetween. A drain signal Rd is applied through a contact section 134 to a common drain region between the two reset gate electrodes 132 in the belt-shaped diffusion region 131. Further, the source region of one of the reset transistors, i.e., reset transistor Rt1, is connected with wiring 112*b* that is connected with the signal charge accumulating section (FD section) 108, with a contact section 133 interposed therebetween. The source region of the other reset transistor, i.e., reset transistor Rt2, is connected with a second conductivity type signal charge accumulating section (FD section) common to the pixel in the first row and the pixel in the second row in the pixel section 151 illustrated in FIG. 1.

Two amplifying transistors At1 and At2 are formed on the belt-shaped diffusion region 141, and an amplifying gate electrode 142 is disposed in such a manner to intersect with the belt-shaped diffusion region 141, with a gate insulation film (not shown) interposed therebetween. A power source voltage Vdd (e.g., 2.5V) is applied through a contact section 144 to a common drain region between the two amplifying gate electrodes 142 in this belt-shaped diffusion region 141. Further, the source region of one of the amplifying transistors, i.e., amplifying transistor At1, is connected with a reading signal line Lr with a contact section 143 interposed therebetween. The source region of the other amplifying transistor, i.e., amplifying transistor At2, is also connected with the reading signal line Lr corresponding to the same pixel column, with the contact section 143 interposed therebetween. Further, the gate electrode 142 of one of the amplifying transistors, i.e., amplifying transistor At1, is connected with wiring 112b that is connected with the signal charge accumulating section (FD section) 108. The gate electrode 142 of the other amplifying transistor, i.e., amplifying transistor At2, is connected with a signal charge accumulating section (FD section) common to the pixel in the fifth row and the pixel in the sixth row of the pixel section 151 illustrated in FIG. 1.

Next, the working effect of the solid-state imaging apparatus according to Embodiment 2 will be described hereinafter.

In the solid-state imaging apparatus 100b having such a configuration as described above, the second conductivity type signal charge accumulating section (FD section) 108a is disposed within an opening 117a of a transfer gate electrode 117, and it does not come in contact with an element separating region 105. Accordingly, transfer gate electrodes 117, which are disposed in parallel (transfer gate electrodes disposed adjacent to each other top and bottom in FIG. 6(b)), can be disposed even closer to each other, which makes it possible to reduce a pixel area.

In the disposition of the pixel section illustrated in FIG. 6(a), it becomes possible to dispose the second conductivity type signal charge accumulating section (FD section) 108a and the p-well region 104 accompanying the element separating region 105, with the electric charge transfer section p⁻ region 109a interposed therebetween. This will facilitate to expand the area for the electric charge transfer section p⁻ region 109a.

Specifically, since the p-well regions 104 are disposed on both the left and right sides of the second conductivity type signal charge accumulating section 108 in the solid-state imaging apparatus 100a according to Embodiment 1, width of the first conductivity type electric charge transferring region 109 is restricted by the width of the second conductivity type signal charge accumulating section 108. On the other hand, since the second conductivity type signal charge accumulating section 108a is disposed away from the p-well region 104 in the solid-state imaging apparatus 100a according to Embodiment 2, the electric charge transfer section p⁻ region 109a, including a transferring path from the second conductivity type electric charge accumulating region of the photoelectric conversion element to the second conductivity type signal charge accumulating section 108a, can be disposed in such a manner to surround the second conductivity type signal charge accumulating section 108a.

Thus, the area of the electric charge transfer section p⁻ region 109a can be increased, and the reduction of the area of the electric charge transfer section p⁻ region 109a that is due to impurity diffusion from the p-well region 104 positioned in the periphery of the electric charge transfer section p⁻ region 109a can be suppressed. Thus, further improvement on transferring characteristics can be made.

According to the solid-state imaging apparatus according to Embodiment 2 as described above, in addition to the effect of Embodiment 1, the transfer gate electrodes 117, which are disposed in parallel, are disposed further closer to each other, so that the effect of reducing the area of the pixels and the effect of facilitating the expansion of the area for the electric charge transfer section p⁻ region 109a can be attained.

As a result, a solid-state imaging apparatus can be achieved that is capable of obtaining a high-resolution image in which noises and afterimages are further suppressed.

In Embodiments 1 and 2, the transfer gate electrode 107 is disposed over the surface on the first main surface side of the second conductivity type electric charge accumulating region 102 of the photoelectric conversion elements PD1 and PD2, so that the second conductivity type electric charge accumulating region 102 of the photoelectric conversion element and the front surface p-region 103 thereabove is prevented from receiving any damage from plasma etching in the process of forming the transfer gate electrode 107. Thus, the impurity concentration of the first conductivity type front surface semiconductor region (front surface p-region) 103 is reduced equal to or less than the impurity concentration of the p-well region 104, so that the reduction of the impurity concentration of the first conductivity type front surface semiconductor region (front surface p-region) 103 formed in the front surface region of the second conductivity type electric charge accumulating region 102 of the photoelectric conversion element is actualized. However, the reduction of the impurity concentration of the first conductivity type front surface semiconductor region (front surface p-region) 103 formed in the front surface region of the second conductivity type electric charge accumulating region 102 of the photoelectric conversion element is not limited to the reduction achieved by disposing the transfer gate electrode 107 over the surface on the first main surface side of the second conductivity type electric charge accumulating region 102 of the photoelectric conversion elements PD1 and PD2.

For example, the reduction of the impurity concentration of the first conductivity type front surface semiconductor region (front surface p-region) 103 formed in the front surface region of the second conductivity type electric charge accumulating region 102 of the photoelectric conversion element can also be achieved by using an etching process that causes minor damage to the front surface region of the second conductivity type electric charge accumulating region 102 of the photoelectric conversion element, as the etching process used in the process of forming the transfer gate electrode 107.

Specifically, any etching process that reduces the impurity concentration of the first conductivity type front surface semiconductor region (front surface p-region) 103 equal to or less than the impurity concentration of the p-well region 104 as a result is within the scope of the present invention regardless of the kind of process that achieved the reduction.

Further, although not specifically described in Embodiment 1 or 2 described above, an electronic information device will be described hereinafter. The electronic information device having an image input device, such as a digital camera (e.g., digital video camera or digital still camera), an image input camera, a scanner, a facsimile machine and a camera-equipped cell phone device, includes an imaging section using at least one of the solid-state imaging apparatuses according to Embodiments 1 and 2 described above as an image input device.

(Embodiment 3)

Figure 8:
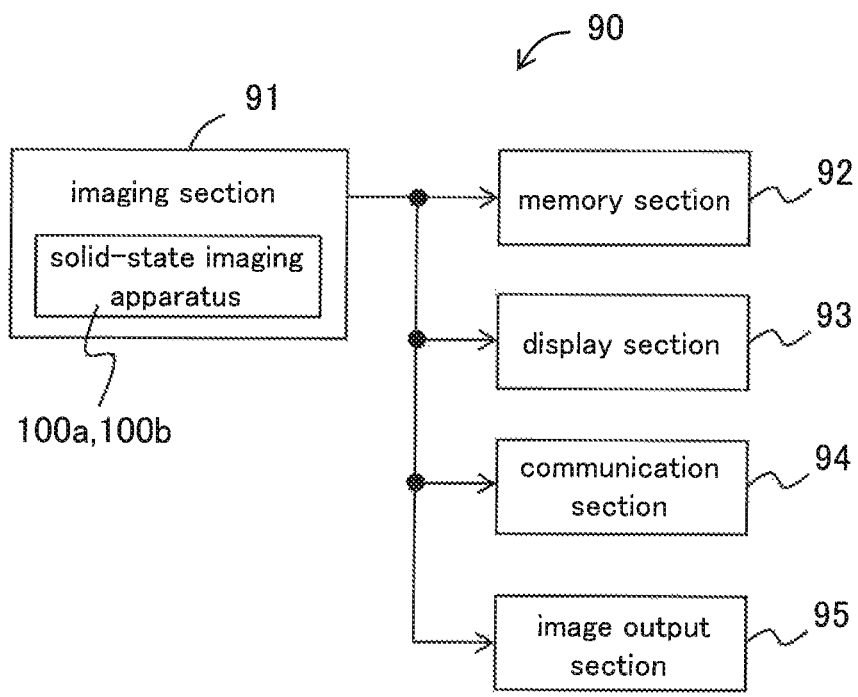
FIG. 8 is a block diagram schematically illustrating an exemplary configuration of an electronic information device, as Embodiment 3 of the present invention, using the solid-state imaging apparatus according to either of Embodiment 1 or 2 of the present invention in an imaging section as an imaging portion.

FIG. 8 is a block diagram schematically illustrating an exemplary configuration of an electronic information device, as Embodiment 3 of the present invention, using the solid-state imaging apparatus according to either of Embodiment 1 or 2 of the present invention in an imaging section.

The electronic information device 90 according to Embodiment 3 of the present invention as illustrated in FIG. 8 comprises at least one of the solid-state imaging apparatus 100a or 100b according to Embodiment 1 or 2 of the present invention, as an imaging section 91 for capturing a subject. The electronic information device 90 further comprises at least any of: a memory section 92 (e.g., recording media) for data-recording a high-quality image data obtained by image capturing using such an imaging section, after predetermined signal processing is performed on the image data for recording; a display section 93 (e.g., liquid crystal display device) for displaying this image data on a display screen (e.g., liquid crystal display screen) after predetermined signal processing is performed for display; a communication section 94 (e.g., transmitting and receiving device) for communicating this image data after predetermined signal processing is performed on the image data for communication; and an image output section 95 for printing (typing out) and outputting (printing out) this image data.

As described above, the present invention is exemplified by the use of its preferred Embodiments. However, the present invention should not be interpreted solely based on Embodiments described above. It is understood that the scope of the present invention should be interpreted solely based on the claims. It is also understood that those skilled in the art can implement equivalent scope of technology, based on the description of the present invention and common knowledge from the description of the detailed preferred Embodiments of the present invention. Furthermore, it is understood that any patent, any patent application and any references cited in the present specification should be incorporated by reference in the present specification in the same manner as the contents are specifically described therein.

INDUSTRIAL APPLICABILITY

In the field of a solid-state imaging apparatus and a driving method of the solid-state imaging apparatus, a manufacturing method of a solid-state imaging apparatus, and an electronic information device, the present invention can achieve a solid-state imaging apparatus capable of obtaining a high-resolution image in which noises and afterimages are further suppressed.

REFERENCE SIGNS LIST 37 photodiode
41 N⁻ type silicon substrate
42 back surface P⁺ layer
43 P well
44 electric charge accumulating N⁴ region
44a N⁻ type region
45 front surface P⁺ layer
46 transfer transistor
47 FD (Floating Diffusion)
48 electric charge transfer P⁻ layer
49 P well
50 N well
90 electronic information device
91 imaging section
92 memory section
93 display section
94 communication section
95 image output section
100 first conductivity type semiconductor substrate (p-type silicon substrate)
100a, 100b solid-state imaging apparatus
101 second conductivity type photoelectric conversion region (n⁻ type semiconductor region)
102 second conductivity type electric charge accumulating region (n type semiconductor region)
103 first conductivity type front surface semiconductor region (front surface p region)
104 first conductivity type well region (p-well region)
105 element separating region
107 transfer gate electrode
108, 108a second conductivity type signal charge accumulating section (electric charge accumulating n⁺ region)
109, 109a first conductivity type electric charge transferring region (electric charge transfer section p⁻ region)
110 first conductivity type back surface semiconductor region
111a, 111b contact section
112a, 112b wiring layer
113a gate insulation film
113b ion implantation protective film
120, 121 resist
120a, 121a resist opening

The invention claimed is:

1. A solid-state imaging apparatus comprising:
a photoelectric conversion element to generate a signal charge by photoelectric conversion of incident light; and
a transfer transistor to transfer the signal charge generated by the photoelectric conversion element to an outside of the photoelectric conversion element, the solid-state imaging apparatus converting, and outputting, the signal charge generated by the photoelectric conversion element into an image signal by signal processing, the solid-state imaging apparatus comprising:
a semiconductor region on a first main surface side of a first conductivity type semiconductor substrate and separated by an element separation region,
wherein a plurality of the photoelectric conversion elements and the transfer transistors are in the semiconductor region, wherein
the photoelectric conversion element includes:
a second conductive type photoelectric conversion region to photoelectrically convert incident light on a second main surface of the first conductivity type semiconductor substrate on an opposite side of the first main surface;
a second conductivity type electric charge accumulating region to accumulate a signal charge generated by photoelectric conversion in the second conductivity type photoelectric conversion region, on to the first main surface side of the first conductivity type semiconductor substrate; and
a first conductivity type front surface semiconductor region on the first main surface side of the second conductivity type electric charge accumulating region to entirely cover the second conductivity type electric charge accumulating region, the semiconductor region separated by the element separation region includes:
   a second conductivity type signal charge accumulating section to accumulate the signal charge transferred from the photoelectric conversion element; and
   a first conductivity type electric charge transferring region to transfer the signal charge from the second conductivity type electric charge accumulating region to the second conductivity type signal charge accumulating section,
the second conductivity type electric charge accumulating region and the first conductivity type electric charge transferring region are on the second conductivity type photoelectric conversion region,
the second conductivity type electric charge accumulating region and the first conductivity type front surface semiconductor region have a same width in a sectional view and a same area in a plan view,
an impurity concentration of the first conductivity type front surface semiconductor region is $1 \times 10^{16} \text{cm}^{-3}$ to $5 \times 10^{17} \text{cm}^{-3}$,
a lateral end of the second conductivity type electric charge accumulating region and a lateral end of the first conductivity type front surface semiconductor region directly contact the first conductivity type electric charge transferring region,
the impurity concentration of the first conductivity type front surface semiconductor region exceeds an impurity concentration of the first conductivity type electric charge transferring region, and
a gate electrode of the transfer transistor entirely covers a surface of the first main surface side of the first conductivity type front surface semiconductor region, a surface of the first main surface side of a region between adjacent photoelectric conversion elements, and a region between the photoelectric conversion element and the element separation region, in the semiconductor region.

2. A solid-state imaging apparatus according to claim 1, wherein the second conductivity type electric charge accumulating region is disposed separately from the second conductivity type signal charge accumulating section, with the first conductivity type electric charge transferring region interposed therebetween.

3. A solid-state imaging apparatus according to claim 2, wherein a space between the second conductivity type electric charge accumulating region and the second conductivity type signal charge accumulating section is equal to or greater than a minimum distance that does not substantially cause a short channel effect as well as equal to or smaller than a permissible maximum distance that is determined by the degree of integration of pixels in the solid-state imaging apparatus.

4. A solid-state imaging apparatus according to claim 2, wherein a space between the second conductivity type electric charge accumulating region and the second conductivity type signal charge accumulating section is within a range of 0.2 μm to 1.0 μm.

5. A solid-state imaging apparatus according to claim 1,
   wherein the semiconductor region separated by the element separation region is a first conductivity type well region within the first conductivity type semiconductor substrate, and
   wherein the first conductivity type front surface semiconductor region has an impurity concentration that is equal to or smaller than an impurity concentration of the first conductivity type well region.

6. A solid-state imaging apparatus according to claim 5, wherein the gate electrode of the transfer transistor is disposed over the surfaces on the first main surface side, of the first conductivity type front surface semiconductor region, the first conductivity type electric charge transferring region and the first conductivity type well region.

7. A solid-state imaging apparatus according to claim 5, wherein the first conductivity type well region surrounds a region that defines the second conductivity type electric charge accumulating region, the first conductivity type electric charge transferring region and the second conductivity type signal charge accumulating section.

8. A solid-state imaging apparatus according to claim 1, wherein the first conductivity type electric charge transferring region is disposed to surround the second conductivity type signal charge accumulating section.

9. A solid-state imaging apparatus according to claim 1, wherein the solid-state imaging apparatus comprises:
   a reset transistor to reset the signal charge of the second conductivity type signal charge accumulating section; and
   an amplifying transistor to amplify signal voltage generated in accordance with the signal charge accumulated in the second conductivity type signal charge accumulating section, and
   wherein the reset transistor and the amplifying transistor are shared among a plurality of pixels.

10. An electronic information device comprising a solid-state imaging apparatus according to claim 1.

* * * * *